(12) United States Patent
Nakajima

(10) Patent No.: US 11,341,080 B2
(45) Date of Patent: May 24, 2022

(54) ELECTRONIC PART, ELECTRONIC INSTRUMENT, AND VEHICLE

(71) Applicant: Seiko Epson Corporation, Tokyo (JP)

(72) Inventor: Katsuhito Nakajima, Minowa (JP)

(73) Assignee: Seiko Epson Corporation

( * ) Notice: Subject to any disclaimer, the term of this patent is extended or adjusted under 35 U.S.C. 154(b) by 101 days.

(21) Appl. No.: 16/854,960

(22) Filed: Apr. 22, 2020

(65) Prior Publication Data

US 2020/0341938 A1  Oct. 29, 2020

(30) Foreign Application Priority Data

Apr. 23, 2019  (JP) .............................. JP2019-081620

(51) Int. Cl.
| | | |
|---|---|---|
| *G06F 13/42* | (2006.01) | |
| *G11C 8/18* | (2006.01) | |
| *H03B 5/32* | (2006.01) | |
| *H03B 5/04* | (2006.01) | |

(52) U.S. Cl.
CPC ............ G06F 13/4291 (2013.01); G11C 8/18 (2013.01); *H03B 5/04* (2013.01); *H03B 5/32* (2013.01); *H03B 2200/0018* (2013.01)

(58) Field of Classification Search
CPC ......... G06F 13/4291; H03B 5/04; H03B 5/32; H03B 2200/0018; G11C 8/18
See application file for complete search history.

(56) References Cited

U.S. PATENT DOCUMENTS

| | | | | |
|---|---|---|---|---|
| 5,410,544 A * | 4/1995 | Kreifels | ................ | G11C 29/48 365/185.04 |
| 9,424,153 B2 * | 8/2016 | Cho | ...................... | G06F 11/263 |
| 2002/0087918 A1 * | 7/2002 | Miura | ................. | G06F 11/3648 714/38.1 |
| 2006/0123306 A1 * | 6/2006 | Whetsel | ................... | G06F 13/40 714/744 |
| 2012/0216079 A1 * | 8/2012 | Fai | ........................ | G06F 11/362 714/42 |
| 2014/0091867 A1 | 4/2014 | Nonoyama | | |
| 2016/0162375 A1 * | 6/2016 | Kim | ...................... | G11C 29/46 714/6.13 |
| 2017/0109097 A1 * | 4/2017 | Lai | ...................... | G06F 13/4068 |

FOREIGN PATENT DOCUMENTS

| | | |
|---|---|---|
| JP | 2008-021396 A | 1/2008 |
| JP | 2014-072716 A | 4/2014 |
| JP | 2016-178606 A | 10/2016 |

* cited by examiner

*Primary Examiner* — Nimesh G Patel
(74) *Attorney, Agent, or Firm* — Harness, Dickey & Pierce, P.L.C.

(57) ABSTRACT

An electronic part including an integrated circuit and a memory, the integrated circuit including a first clock terminal to which a clock signal is inputted, a first data terminal via which a first serial data signal is inputted and outputted, a second clock terminal via which the clock signal is outputted to the memory, a second data terminal via which a second serial data signal is inputted and outputted from and to the memory, and a first interface circuit including a control circuit that controls the communication state of the integrated circuit to be a first communication state in which the first serial data signal inputted to the first data terminal is outputted as the second serial data signal via the second data terminal or a second communication state in which the second serial data signal inputted to the second data terminal is outputted as the first serial data signal via the first data terminal.

8 Claims, 11 Drawing Sheets

ELECTRONIC PART, ELECTRONIC INSTRUMENT, AND VEHICLE

The present application is based on, and claims priority from JP Application Serial Number 2019-081620, filed Apr. 23, 2019, the disclosure of which is hereby incorporated by reference herein in its entirety.

BACKGROUND

1. Technical Field

The present disclosure relates to an electronic part, an electronic instrument, and a vehicle.

2. Related Art

JP-A-2008-21396 describes a memory card including a semiconductor memory and an integrated circuit including a processing circuit that processes a command transmitted from a host instrument via a host interface and controls writing, reading, and deleting of data in the semiconductor memory.

An electronic part of related art including a memory and an integrated circuit, such as the memory card described in JP-A-2008-21396, a clock source in the integrated circuit needs to operate to allow an apparatus external to the electronic part to write and read data to and from the memory. The electronic part of related art therefore has a problem of inaccessibility to the memory from the external apparatus in a state in which the clock source is not in operation or a state in which no clock source is implemented.

SUMMARY

An aspect of an electronic part according to the present disclosure includes an integrated circuit and a memory, and the integrated circuit includes a first clock terminal to which a clock signal is inputted, a first data terminal via which a first serial data signal is inputted and outputted, a second clock terminal via which the clock signal is outputted to the memory, a second data terminal via which a second serial data signal is inputted and outputted from and to the memory, and a first interface circuit including a control circuit that controls a communication state of the integrated circuit based on the clock signal and the first serial data signal to be a first communication state in which the first serial data signal inputted to the first data terminal is outputted as the second serial data signal via the second data terminal or a second communication state in which the second serial data signal inputted to the second data terminal is outputted as the first serial data signal via the first data terminal.

In the aspect of the electronic part, the control circuit may switch the first communication state to the second communication state and vice versa based on the number of pulses of the clock signal.

In the aspect of the electronic part, a method of communication performed by the first interface circuit via the first clock terminal and the first data terminal may be the same as a method of communication performed between the first interface circuit and the memory via the second clock terminal and the second data terminal.

In the aspect of the electronic part, the integrated circuit may include a storage and a second interface circuit that controls writing and reading of data to and from the storage based on the clock signal and the first serial data signal.

In the aspect of the electronic part, the second interface circuit may switch an operation mode of the integrated circuit, based on the clock signal and the first serial data signal, from a first mode that permits no access to the memory via the first interface circuit to a second mode that permits access to the memory via the first interface circuit, and the first interface circuit may control writing and reading of data to and from the memory in the second mode by causing the control circuit to control the communication state of the integrated circuit to be the first or second communication state.

In the aspect of the electronic part, when a slave address contained in the first serial data signal has a first address value allocated to the memory, the control circuit of the first interface circuit may control writing and reading of data to and from the memory by controlling the communication state of the integrated circuit to be the first or second communication state, and the second interface circuit may control writing and reading of data to and from the storage when the slave address has a second address value allocated to the integrated circuit.

An aspect of an electronic instrument according to the present disclosure includes the aspect of the electronic part and a processing circuit that outputs the clock signal to the first clock terminal and inputs and outputs the first serial data signal from and to the first data terminal.

An aspect of a vehicle according to the present disclosure includes the aspect of the electronic part and a processing circuit that outputs the clock signal to the first clock terminal and inputs and outputs the first serial data signal from and to the first data terminal.

DESCRIPTION OF EXEMPLARY EMBODIMENTS

Preferable embodiments of the present disclosure will be described below in detail with reference to the drawings. It is not intended that the embodiments described below unduly limit the contents of the present disclosure set forth in the appended claims. Further, all configurations described below are not necessarily essential configuration requirements of the present disclosure.

1. Electronic Part

1-1. First Embodiment

Figure 1:
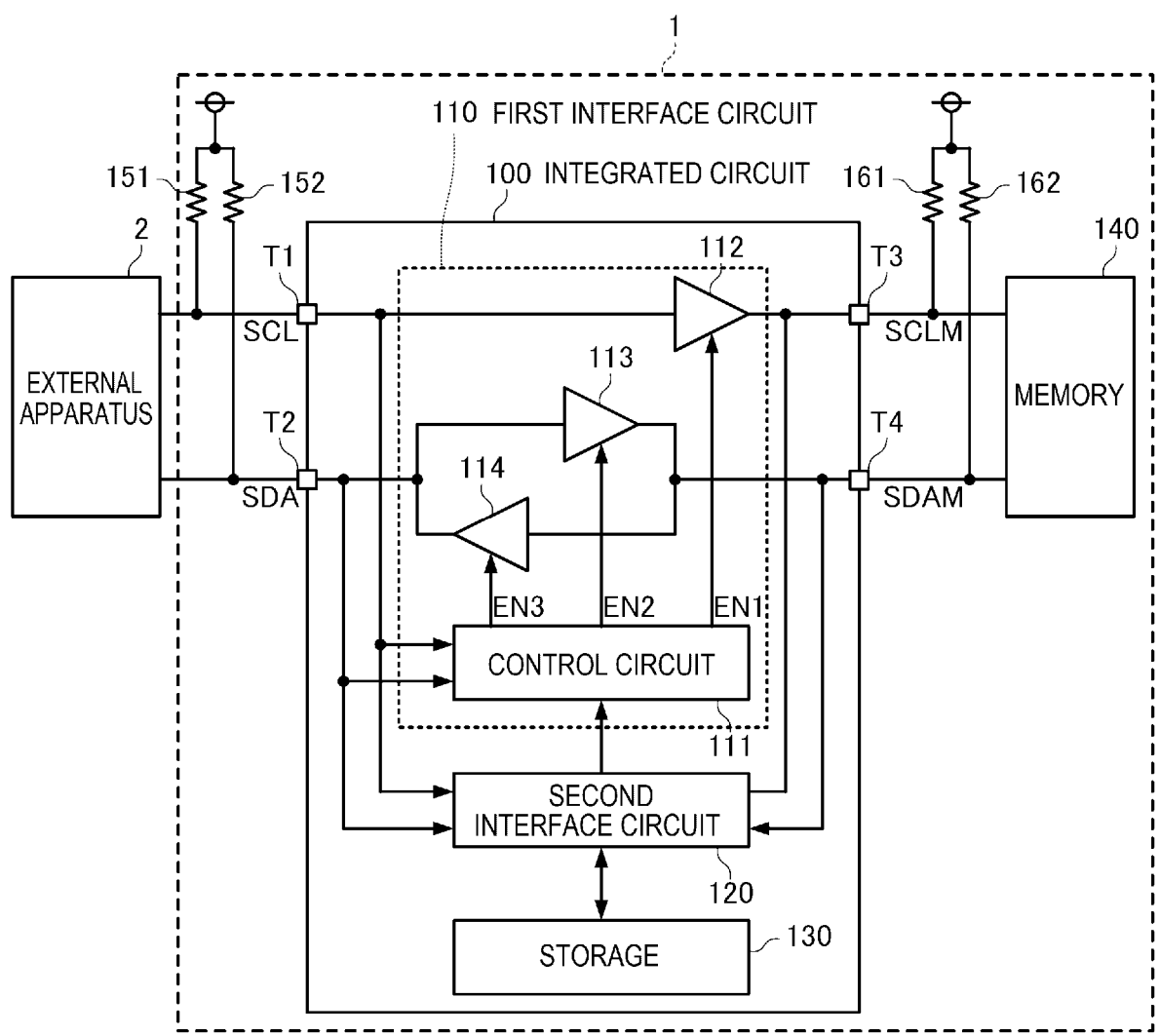
FIG. 1 shows an example of the configuration of an electronic part according to a first embodiment.

FIG. 1 shows an example of the configuration of an electronic part according to a first embodiment. An electronic part 1 according to the first embodiment includes an integrated circuit 100 and a memory 140, as shown in FIG. 1. The electronic part 1 may further include resistive elements 151, 152, 161, and 162.

The integrated circuit 100 includes a first clock terminal T1, a first data terminal T2, a second clock terminal T3, and a second data terminal T4.

The first clock terminal T1 is a terminal to which a clock signal SCL is inputted from an external apparatus 2, which is an apparatus external to the electronic part 1. The first data terminal T2 is a terminal via which a first serial data signal SDA is inputted and outputted from and to the external apparatus 2. The second clock terminal T3 is a terminal via which the clock signal SCL is outputted as a clock signal SCLM to the memory 140. The second data terminal T4 is a terminal via which a second serial data signal SDAM is inputted and outputted from and to the memory 140.

The integrated circuit 100 further includes a first interface circuit 110. The first interface circuit 110 controls writing and reading of data performed by the external apparatus 2 to and from the memory 140.

The first interface circuit 110 includes a control circuit 111. The control circuit 111 controls the state of communication performed by the integrated circuit 100 to be a first or second communication state based on the clock signal SCL and the first serial data signal SDA. The first communication state is a state in which the first serial data signal SDA inputted from the external apparatus 2 to the first data terminal T2 is outputted as the second serial data signal SDAM to the memory 140 via the second data terminal T4. The second communication state is a state in which the second serial data signal SDAM inputted from the memory 140 to the second data terminal T4 is outputted as the first serial data signal SDA to the external apparatus 2 via the first data terminal T2.

In the present embodiment, the method of communication performed by the first interface circuit 110 via the first clock terminal T1 and the first data terminal T2 is the same as the method of communication performed between the first interface circuit 110 and the memory 140 via the second clock terminal T3 and the second data terminal T4. In other words, the method of communication between the external apparatus 2 and the first interface circuit 110 based on the clock signal SCL and the first serial data signal SDA is the same as the method of communication between the first interface circuit 110 and the memory 140 based on the clock signal SCLM and the second serial data signal SDAM. Specifically, in the present embodiment, the method of communication between the external apparatus 2 and the first interface circuit 110 and the method of communication between the first interface circuit 110 and the memory 140 each comply with the $I^2C$ (inter-integrated circuit) scheme.

The first interface circuit 110 further includes buffers 112, 113, and 114.

The buffer 112 is a buffer to which the clock signal SCL is inputted and which outputs a low-level signal or has high-impedance output in accordance with the logical level of an enable signal EN1 and the logical level of the clock signal SCL. Specifically, the buffer 112 has high-impedance output when the enable signal EN1 has the low level, outputs the low-level signal when the enable signal EN1 has the high level and the clock signal SCL has the low level, and has the high-impedance output when the clock signal SCL has the high level.

The buffer 113 is a buffer to which the first serial data signal SDA is inputted and which outputs the low-level signal or has the high-impedance output in accordance with the logical level of an enable signal EN2 and the logical level of the first serial data signal SDA. Specifically, the buffer 113 has the high-impedance output when the enable signal EN2 has the low level, outputs the low-level signal when the enable signal EN2 has the high level and the first serial data signal SDA has the low level, and has the high-impedance output when the first serial data signal SDA has the high level.

The buffer 114 is a buffer to which the second serial data signal SDAM is inputted and which outputs the low-level signal or has the high-impedance output in accordance with the logical level of an enable signal EN3 and the logical level of the second serial data signal SDAM. Specifically, the buffer 114 has the high-impedance output when the enable signal EN3 has the low level, outputs the low-level signal when the enable signal EN3 has the high level and the second serial data signal SDAM has the low level, and has the high-impedance output when the second serial data signal SDAM has the high level.

The integrated circuit 100 further includes a second interface circuit 120 and a storage 130.

The storage 130 includes a variety of registers, such as a register that stores a variety of data for controlling the action of each circuit and a register for controlling the integrated circuit 100 or the electronic part 1.

The second interface circuit 120 controls writing and reading of data performed by the external apparatus 2 to and from the storage 130 based on the clock signal SCL and the first serial data signal SDA. In the present embodiment, the method of communication between the external apparatus 2 and the second interface circuit 120 complies with the $I^2C$ scheme, as do the method of communication between the external apparatus 2 and the first interface circuit 110 and the method of communication between the first interface circuit 110 and the memory 140.

The resistive element 151 is electrically coupled to a power supply and the first clock terminal T1 and is located therebetween. The resistive element 152 is electrically coupled to the power supply and the first data terminal T2 and is located therebetween. The resistive elements 151 and 152 function as pull-up resistors for achieving the $I^2C$ communication between the external apparatus 2 and the first interface circuit 110 or the second interface circuit 120. Therefore, when no clock signal SCL is outputted from the external apparatus 2, the resistive element 151 pulls up the clock signal SCL to the high-level clock signal SCL. When the buffer 114 has the high-impedance output, the resistive element 152 pulls up the first serial data signal SDA to the high-level first serial data signal SDA.

The resistive element 161 is electrically coupled to a power supply and the second clock terminal T3 and is located therebetween. The resistive element 162 is electrically coupled to the power supply and the second data terminal T4 and is located therebetween. The resistive elements 161 and 162 function as pull-up resistors for achieving the I²C communication between the first interface circuit 110 or the second interface circuit 120 and the memory 140. Therefore, when the buffer 112 has the high-impedance output, the resistive element 161 pulls up the clock signal SCLM to the high-level clock signal SCLM. When the buffer 113 has the high-impedance output, the resistive element 162 pulls up the second serial data SDAM to the high-level second serial data signal SDAM. The resistive elements 151, 152, 161, and 162 may be built in the integrated circuit 100.

In the present embodiment, the integrated circuit 100 has, as an operation mode, a first mode in which no access to the memory 140 via the first interface circuit 110 is permitted and a second mode in which access to the memory 140 via the first interface circuit 110 is permitted.

In the present embodiment, when the electronic part 1 is powered on, the action mode of the integrated circuit 100 is initialized to the first mode, and the second interface circuit 120 outputs a signal that prohibits access to the memory 140 to the control circuit 111 of the first interface circuit 110. As a result, in the first mode, the control circuit 111 causes all the enable signals EN1, EN2, and EN3 to have the low level and all the buffers 112, 113, and 114 to have the high-impedance output.

The second interface circuit 120 then produces the clock signal SCLM and the second serial data signal SDAM for reading a variety of data stored in the memory 140 and loads the variety of data read from the memory 140 into the variety of registers of the storage 130. Each circuit of the integrated circuit 100 is thus set in a desired state.

The second interface circuit 120 communicates with the external apparatus 2 via the first clock terminal T1 and the first data terminal T2 in the first mode.

In the present embodiment, the second interface circuit 120 switches the action mode of the integrated circuit 100 from the first mode to the second mode based on the clock signal SCL and the first serial data signal SDA. In the second mode, the first interface circuit 110 then control the writing and reading of data to and from the memory 140 when the control circuit 111 controls the communication state of the integrated circuit 100 to be a first or second communication state.

In the present embodiment, a first address value is allocated to the memory 140, and a second address value different from the first address value is allocated to the integrated circuit 100. In the first mode, when a slave address contained in the first serial data signal SDA transmitted from the external apparatus 2 coincides with the second address value, writing and reading data to and from the integrated circuit 100 is permitted. In the first mode, when the second interface circuit 120 receives from the external apparatus 2 a memory access request command that requests access to the memory 140, the second interface circuit 120 outputs a signal that permits access to the memory 140 to the control circuit 111 of the first interface circuit 110. As a result, when the action mode of the integrated circuit 100 is switched from the first mode to the second mode, and when the slave address contained in the first serial data signal SDA transmitted from the external apparatus 2 coincides with the first address value in the second mode, writing and reading data to and from the memory 140 is permitted. In the second mode, the control circuit 111 controls the communication mode of the integrated circuit 100 to be the first or second communication mode based on the clock signal SCL and the first serial data signal SDA.

In the present embodiment, when the first mode is switched to the second mode, the control circuit 111 first controls the communication state of the integrated circuit 100 to be the first communication state. Specifically, the control circuit 111 sets the level of each of the enable signals EN1 and EN2 at the high level and sets the level of the enable signal EN3 at the low level. As a result, the buffer 112 outputs the low-level signal or has the high-impedance output in accordance with the logical level of the clock signal SCL, and the clock signal SCLM has the same logical level as that of the clock signal SCL. The buffer 113 outputs the low-level signal or has the high-impedance output in accordance with the logical level of the first serial data signal SDA, and the second serial data signal SDAM has the same logical level as that of the first serial data signal SDA. The buffer 114 has the high-impedance output. The control circuit 111 thus controls the communication state of the integrated circuit 100 to be the first communication state.

In the present embodiment, when the number of pulses of the clock signal SCL reaches a predetermined number, the control circuit 111 switches the communication state of the integrated circuit 100 from the first communication state to the second communication state in accordance with a predetermined communication method. Specifically, when the number of pulses of the clock signal SCL reaches the predetermined number, the control circuit 111 maintains the enable signal EN1 at the high level, changes the level of the enable signal EN2 from the high level to the low level, and changes the level of the enable signal EN3 from the low level to the high level. As a result, the buffer 112 outputs the low-level signal or has the high-impedance output in accordance with the logical level of the clock signal SCL, and the clock signal SCLM has the same logical level as that of the clock signal SCL. The buffer 113 has the high-impedance output. The buffer 114 outputs the low-level signal or has the high-impedance output in accordance with the logical level of the second serial data signal SDAM, and the first serial data signal SDA has the same logical level as that of the second serial data signal SDAM. The control circuit 111 thus controls the communication state of the integrated circuit 100 to be the second communication state.

The control circuit 111 then also controls the communication state of the integrated circuit 100 to be the first or second communication state until the communication ends in accordance with the predetermined communication method based on the number of pulses of the clock signal SCL. The control circuit 111 thus switches the communication state between the first communication state and the second communication state based on the number of pulses of the clock signal SCL.

In the second mode, when the second interface circuit 120 receives from the external apparatus 2 a storage access request command that requests access to the storage 130, the second interface circuit 120 outputs a signal that prohibits access to the memory 140 to the control circuit 111 of the first interface circuit 110. The action mode of the integrated circuit 100 is thus switched from the second mode to the first mode.

The memory 140 stores a variety of data for controlling the action of each circuit that is provided in the integrated circuit 100 but is not shown. The memory 140 is, for example, a nonvolatile memory that allows rewriting multiple times, such as an EEPROM (electrically erasable programmable read-only memory).

The external apparatus 2 may, for example, be an inspection apparatus that inspects the electronic part 1 or the integrated circuit 100. The external apparatus 2, which is an inspection apparatus, writes a variety of data onto the memory 140 via the first interface circuit 110. Further, the external apparatus 2 transmits a reloading command to the integrated circuit 100, and the second interface circuit 120 receives the reloading command and loads the variety of data written onto the memory 140 to the registers provided in the storage 130. In this state, the external apparatus 2 inspects the action of the electronic part 1 or the integrated circuit 100, and when the result of the inspection is not OK, the external apparatus 2 writes the variety of data having undergone fine adjustment onto the memory 140 and inspects the action again. The external apparatus 2 then repeats the writing of the variety of data having undergone fine adjustment onto the memory 140 and the reinspection of the action until the result of the inspection is OK.

The external apparatus 2 may instead, for example, be a host apparatus that controls the action of the electronic part 1 or the integrated circuit 100. The external apparatus 2, which is a host apparatus, writes a variety of data onto the storage 130 via the second interface circuit 120, and the integrated circuit 100 operates in accordance with the variety of data written onto the storage 130. When the electronic part 1, for example, operates abnormally, the external apparatus 2 may read the variety of data from the memory 140 via the first interface circuit 110 and analyze a cause of the abnormality.

Figure 2:
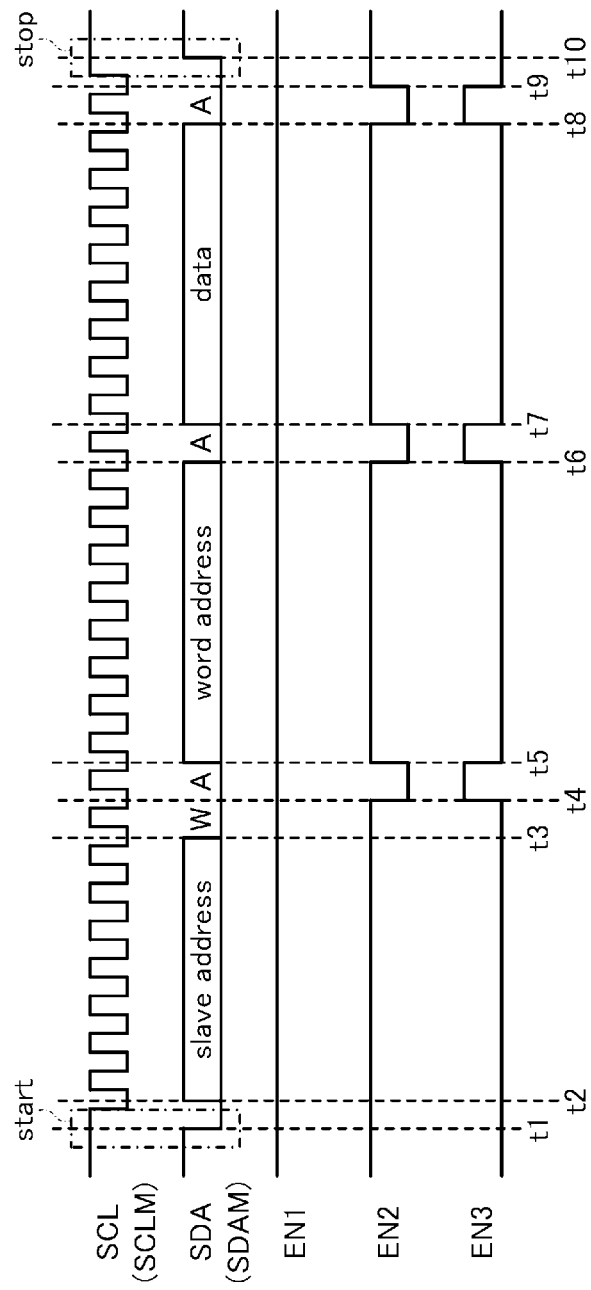
FIG. 2 is a timing chart in accordance with which an external apparatus writes data onto a memory.

FIG. 2 is a timing chart showing examples of the waveforms of a variety of signals used when the external apparatus 2 writes data onto the memory 140 by performing the I²C communication.

In FIG. 2, the action mode of the integrated circuit 100 has been switched from the first mode to the second mode before time t1. In the second mode, the control circuit 111 first sets the enable signals EN1 and EN2 at the high level and sets the enable signal EN3 at the low level to at the low level to control the communication state of the integrated circuit 100 to be the first communication state.

At the time t1, the external apparatus 2 outputs the high-level clock signal SCL and outputs the first serial data signal SDA that changes from the high level to the low level, and the control circuit 111 detects a start condition. Since the enable signals EN1 and EN2 each have the high level, the clock signal SCLM has the same logical level as that of the clock signal SCL, the second serial data signal SDAM has the same logical level as that of the first serial data signal SDA, and the memory 140 detects the start condition. The communication between the external apparatus 2 and the memory 140 thus starts.

In the period from time t2 to time t3, the external apparatus 2 outputs the clock signal SCL containing 7 pulses and the first serial data signal SDA containing a 7-bit slave address. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the 7-bit slave address contained in the second serial data signal SDAM in synchronization with the rising edges of the 7 pulses contained in the clock signal SCLM.

In the period from the time t3 to time t4, the external apparatus 2 outputs the clock signal SCL containing 1 pulse and the first serial data signal SDA containing a low-level write bit that requests writing of data onto the memory 140. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the write bit contained in the second serial data signal SDAM in synchronization with the rising edge of the pulse contained in the clock signal SCLM.

The control circuit 111 changes the level of the enable signal EN2 from the high level to the low level and the level of the enable signal EN3 from the low level to the high level at the time t4 in synchronization with the falling edge of the pulse contained in the clock signal SCL and immediately before the time t4 to switch the communication state from the first communication state to the second communication state. That is, in the example shown in FIG. 2, the control circuit 111 detects the start condition at the time t1, and when the number of pulses of the clock signal SCL reaches 8, the control circuit 111 switches the communication state from the first communication state to the second communication state.

In the example shown in FIG. 2, in the period from the time t2 to the time t3, the 7-bit slave address received by the memory 140 coincides with the first address value allocated to the memory 140, and the memory 140 outputs the second serial data signal SDAM containing a low-level acknowledgement bit in synchronization with the falling edge of the pulse contained in the clock signal SCLM and immediately before the time t4.

In the period from the time t4 to time t5, the external apparatus 2 outputs the clock signal SCL containing 1 pulse. Since the enable signal EN3 has the high level, the first serial data signal SDA has the same logical level as that of the second serial data signal SDAM, and the external apparatus 2 receives an acknowledgement bit contained in the first serial data signal SDA in synchronization with the rising edge of the pulse contained in the clock signal SCL. Since the enable signal EN1 has the high level, the clock signal SCLM has the same logical level as that of the clock signal SCL, and the memory 140 stops outputting the acknowledgement bit in synchronization with the falling edge of the pulse contained in the clock signal SCLM.

The control circuit 111 changes the level of the enable signal EN2 from the low level to the high level and the level of the enable signal EN3 from the high level to the low level at the time t5 in synchronization with the falling edge of the pulse contained in the clock signal SCL and immediately before the time t5 to switch the communication state from the second communication state to the first communication state. That is, in the example shown in FIG. 2, the control circuit 111 detects the start condition at the time t1, and when the number of pulses of the clock signal SCL reaches 9, the control circuit 111 switches the communication state from the second communication state to the first communication state.

In the period from the time t5 to time t6, the external apparatus 2 outputs the clock signal SCL containing 8 pulses and the first serial data signal SDA containing an 8-bit word address. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the 8-bit word address contained in the second serial data signal SDAM in synchronization with the rising edges of the 8 pulses contained in the clock signal SCLM.

The control circuit 111 changes the level of the enable signal EN2 from the high level to the low level and the level of the enable signal EN3 from the low level to the high level at the time t6 in synchronization with the falling edge of the pulse contained in the clock signal SCL and immediately before the time t6 to switch the communication state from the first communication state to the second communication state. That is, in the example shown in FIG. 2, the control circuit 111 detects the start condition at the time t1, and when the number of pulses of the clock signal SCL reaches 17, the control circuit 111 switches the communication state from the first communication state to the second communication state. The memory 140 outputs the second serial data signal SDAM containing the low-level acknowledgement bit in synchronization with the falling edge of the pulse contained in the clock signal SCLM and immediately before the time t6.

In the period from the time t6 to time t7, the external apparatus 2 outputs the clock signal SCL containing 1 pulse. Since the enable signal EN3 has the high level, the first serial data signal SDA has the same logical level as that of the second serial data signal SDAM, and the external apparatus 2 receives the acknowledgement bit contained in the first serial data signal SDA in synchronization with the rising edge of the pulse contained in the clock signal SCL. Since the enable signal EN1 has the high level, the clock signal SCLM has the same logical level as that of the clock signal SCL, and the memory 140 stops outputting the acknowledgement bit in synchronization with the falling edge of the pulse contained in the clock signal SCLM.

The control circuit 111 changes the level of the enable signal EN2 from the low level to the high level and the level of the enable signal EN3 from the high level to the low level at the time t7 in synchronization with the falling edge of the pulse contained in the clock signal SCL and immediately before the time t7 to switch the communication state from the second communication state to the first communication state. That is, in the example shown in FIG. 2, the control circuit 111 detects the start condition at the time t1, and when the number of pulses of the clock signal SCL reaches 18, the control circuit 111 switches the communication state from the second communication state to the first communication state.

In the period from the time t7 to time t8, the external apparatus 2 outputs the clock signal SCL containing 8 pulses and the first serial data signal SDA containing 8-bit data. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the 8-bit data contained in the second serial data signal SDAM in synchronization with the rising edges of the 8 pulses contained in the clock signal SCLM. The 8-bit data received in the period from the time t7 to the time t8 is then written onto the memory 140 at the 8-bit word address received in the period from the time t5 to the time t6.

The control circuit 111 changes the level of the enable signal EN2 from the high level to the low level and the level of the enable signal EN3 from the low level to the high level at the time t8 in synchronization with the falling edge of the pulse contained in the clock signal SCL and immediately before the time t8 to switch the communication state from the first communication state to the second communication state. That is, in the example shown in FIG. 2, the control circuit 111 detects the start condition at the time t1, and when the number of pulses of the clock signal SCL reaches 26, the control circuit 111 switches the communication state from the first communication state to the second communication state. The memory 140 outputs the second serial data signal SDAM containing the low-level acknowledgement bit in synchronization with the falling edge of the pulse contained in the clock signal SCLM and immediately before the time t8.

In the period from the time t8 to time t9, the external apparatus 2 outputs the clock signal SCL containing 1 pulse. Since the enable signal EN3 has the high level, the first serial data signal SDA has the same logical level as that of the second serial data signal SDAM, and the external apparatus 2 receives the acknowledgement bit contained in the first serial data signal SDA in synchronization with the rising edge of the pulse contained in the clock signal SCL.

At time t10, the external apparatus 2 outputs the high-level clock signal SCL and outputs the first serial data signal SDA that changes from the low level to the high level, and the control circuit 111 detects a stop condition. Since the enable signals EN1 and EN2 each have the high level, the clock signal SCLM has the same logical level as that of the clock signal SCL, the second serial data signal SDAM has the same logical level as that of the first serial data signal SDA, and the memory 140 detects the stop condition. The communication between the external apparatus 2 and the memory 140 thus ends.

Figure 3:
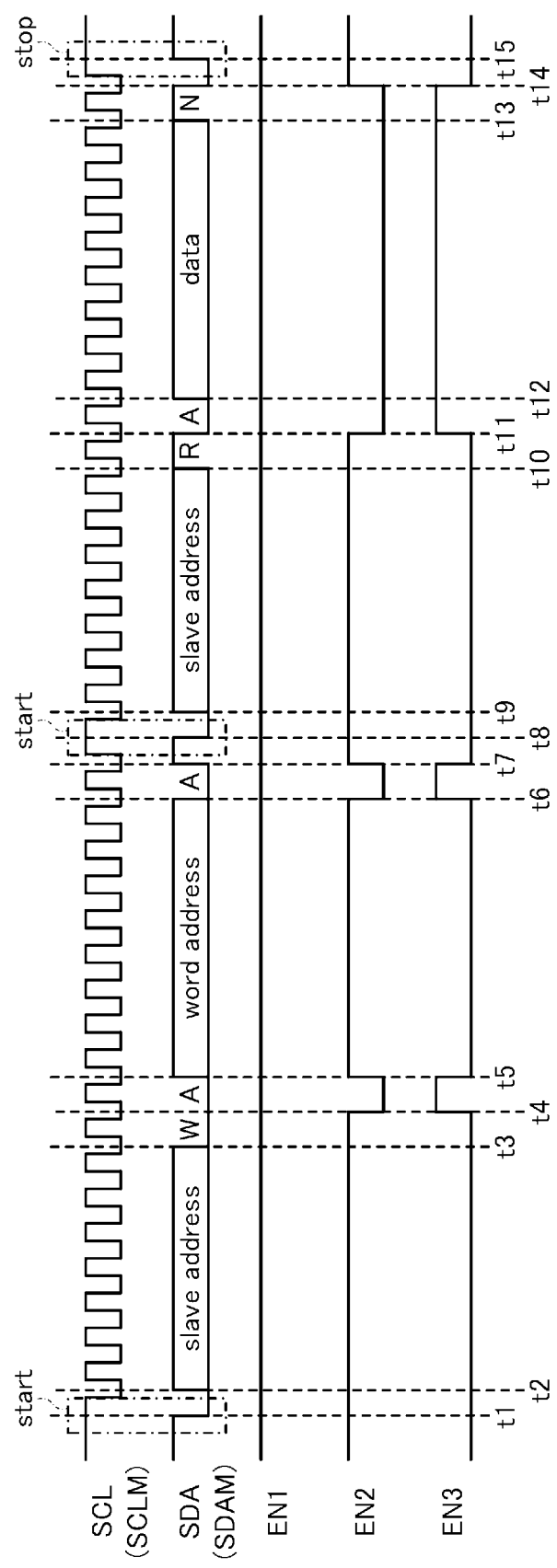
FIG. 3 is a timing chart in accordance with which the external apparatus reads data from the memory.

FIG. 3 is a timing chart showing examples of the waveforms of a variety of signals used when the external apparatus 2 reads data from the memory 140 by using the I²C communication.

In FIG. 3, the waveforms of the signals from the time t1 to the time t7 are the same as those in FIG. 2 and will therefore not be described.

In the example shown in FIG. 3, at the time t8, the external apparatus 2 outputs the high-level clock signal SCL and the first serial data signal SDA that changes from the high level to the low level. Since the enable signals EN1 and EN2 each have the high level, the clock signal SCLM has the same logical level as that of the clock signal SCL, the second serial data signal SDAM has the same logical level as that of the first serial data signal SDA, and the memory 140 detects the start condition.

In the period from the time t9 to the time t10, the external apparatus 2 outputs the clock signal SCL containing 7 pulses and the first serial data signal SDA containing a 7-bit slave address. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the 7-bit slave address contained in the second serial data signal SDAM in synchronization with the rising edges of the 7 pulses contained in the clock signal SCLM.

In the period from the time t10 to time t11, the external apparatus 2 outputs the clock signal SCL containing 1 pulse and the first serial data signal SDA containing a high-level read bit that requests reading of data from the memory 140. Since the enable signals EN1 and EN2 each have the high level, the clock signal SCLM has the same logical level as that of the clock signal SCL, the second serial data signal SDAM has the same logical level as that of the first serial data signal SDA, and the memory 140 receives the read bit contained in the second serial data signal SDAM in synchronization with the rising edge of the pulse contained in the clock signal SCLM.

The control circuit 111 changes the level of the enable signal EN2 from the high level to the low level and the level of the enable signal EN3 from the low level to the high level at the time t11 in synchronization with the falling edge of the pulse contained in the clock signal SCL and immediately before the time t11 to switch the communication state from the first communication state to the second communication state. That is, in the example shown in FIG. 3, the control circuit 111 detects the start condition at the time t8, and when the number of pulses of the clock signal SCL reaches 8, the control circuit 111 switches the communication state from the first communication state to the second communication state.

In the example shown in FIG. 3, in the period from the time t9 to the time t10, the 7-bit slave address received by the memory 140 coincides with the first address value allocated to the memory 140, and the memory 140 outputs the second serial data signal SDAM containing a low-level acknowledgement bit in synchronization with the falling edge of the pulse contained in the clock signal SCLM and immediately before the time t11.

In the period from the time t11 to time t12, the external apparatus 2 outputs the clock signal SCL containing 1 pulse. Since the enable signal EN3 has the high level, the first serial data signal SDA has the same logical level as that of the second serial data signal SDAM, and the external apparatus 2 receives an acknowledgement bit contained in the first serial data signal SDA in synchronization with the rising edge of the pulse contained in the clock signal SCL. Since the enable signal EN1 has the high level, the clock signal SCLM has the same logical level as that of the clock signal SCL.

In the period from the time t12 to time t13, the external apparatus 2 outputs the clock signal SCL containing 8 pulses. Since the enable signal EN1 has the high level, the clock signal SCLM has the same logical level as that of the clock signal SCL. The memory 140 outputs the second serial data signal SDAM containing the 8-bit data stored at the 8-bit word address received in the period from the time t5 to the time t6 in synchronization with the falling edge of the pulse contained in the clock signal SCLM and immediately before the time t12 and the falling edges of the first 7 pulses in the period from the time t2 to the time t13. Since the enable signal EN3 has the high level, the first serial data signal SDA has the same logical level as that of the second serial data signal SDAM, and the external apparatus 2 receives the 8-bit data contained in the first serial data signal SDA in synchronization with the rising edges of the 8 pulses contained in the clock signal SCL. The memory 140 outputs the second serial data signal SDAM containing a high-level non-acknowledgement bit in synchronization with the falling edge of a pulse contained in the clock signal SCLM that is the last pulse in the period from the time t12 to the time t13.

In the period from the time t13 to time t14, the external apparatus 2 outputs the clock signal SCL containing 1 pulse. Since the enable signal EN3 has the high level, the first serial data signal SDA has the same logical level as that of the second serial data signal SDAM, the external apparatus 2 receives the non-acknowledgement bit contained in the first serial data signal SDA in synchronization with the rising edge of the pulse contained in the clock signal SCL. Since the enable signal EN1 has the high level, the clock signal SCLM has the same logical level as that of the clock signal SCL, the memory 140 stops outputting the non-acknowledgement bit and outputs the low-level second serial data signal SDAM in synchronization with the falling edge of the pulse contained in the clock signal SCLM.

The control circuit 111 changes the level of the enable signal EN2 from the low level to the high level and the level of the enable signal EN3 from the high level to the low level at the time t14 in synchronization with the falling edge of the pulse contained in the clock signal SCL and immediately before the time t14 to switch the communication state from the second communication state to the first communication state. That is, in the example shown in FIG. 3, the control circuit 111 detects the start condition at the time t8, and when the number of pulses of the clock signal SCL reaches 18, the control circuit 111 switches the communication state from the second communication state to the first communication state.

At time t15, the external apparatus 2 outputs the high-level clock signal SCL and outputs the first serial data signal SDA that changes from the low level to the high level, and the control circuit 111 detects the stop condition. Since the enable signals EN1 and EN2 each have the high level, the clock signal SCLM has the same logical level as that of the clock signal SCL, the second serial data signal SDAM has the same logical level as that of the first serial data signal SDA, and the memory 140 detects the stop condition. The communication between the external apparatus 2 and the memory 140 thus ends.

Figure 4:
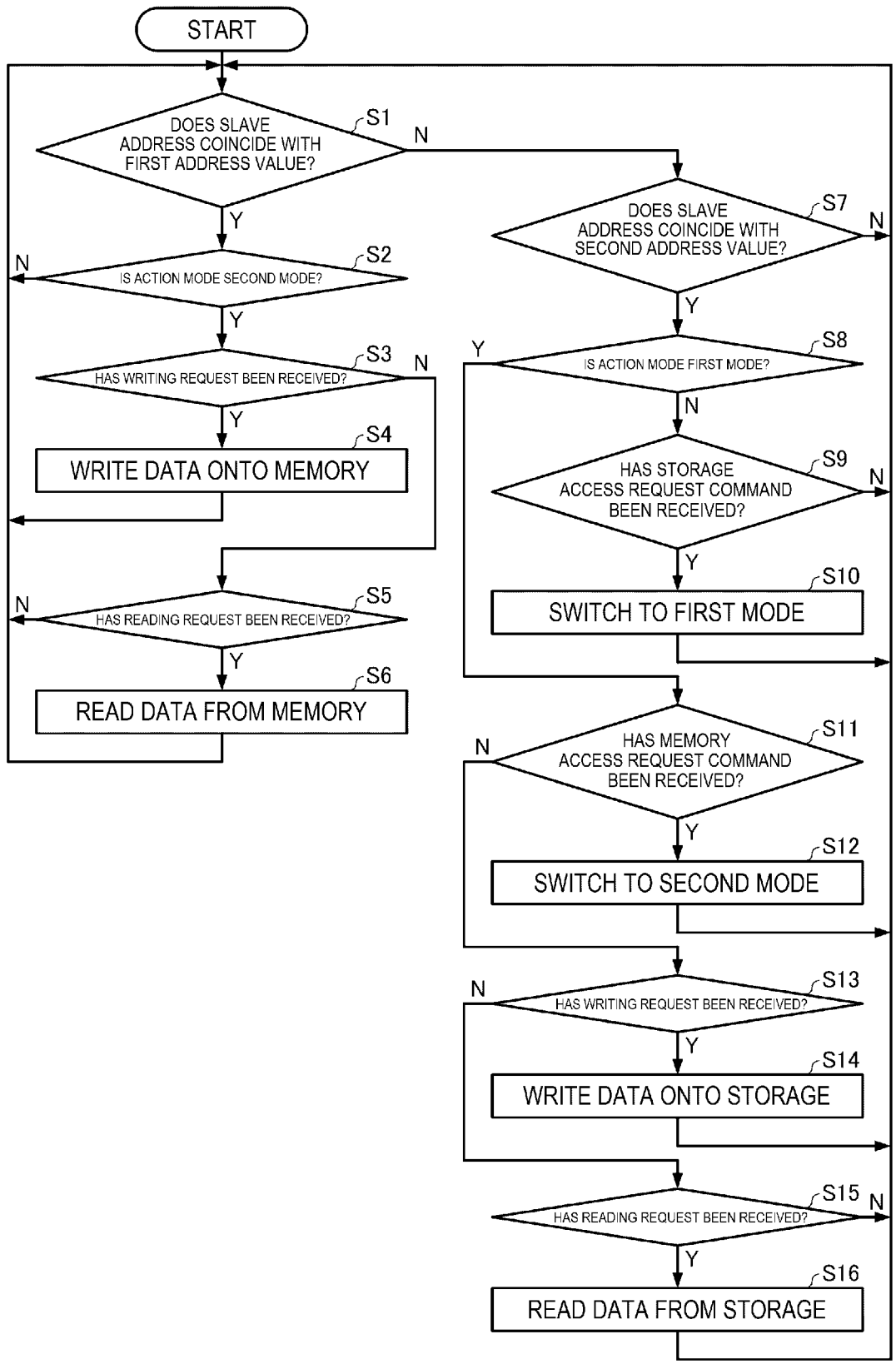
FIG. 4 is a flowchart showing an example of the procedure of processes carried out by the electronic part according to the first embodiment.

FIG. 4 is a flowchart showing an example of the procedure of processes carried out by the electronic part 1.

In the example shown in FIG. 4, the electronic part 1 first evaluates whether or not the slave address contained in the first serial data signal SDA coincides with the first address value (step S1).

When the following conditions are satisfied: The slave address coincides with the first address value (Y in step S1); the action mode of the integrated circuit 100 is the second mode (Y in step S2); and the electronic part 1 receives a data writing request (Y in step S3), the electronic part 1 writes data onto the memory 140 (step S4). The electronic part 1 then carries out the process in step S1 and the following processes again.

When the electronic part 1 does not receive the data writing request (N in step S3) but receives a data reading request (Y in step S5), the electronic part 1 reads data from the memory 140 (step S6). The electronic part 1 then carries out the process in step S1 and the following processes again.

When the slave address coincides with the first address value (Y in step S1), and the action mode of the integrated circuit 100 is the first mode (N in step S2), the electronic part 1 does not carry out the processes in steps S3 to S6.

When the slave address does not coincide with the first address value (N in step S1), the electronic part 1 evaluates whether or not the slave address coincides with the second address value (step S7).

When the following conditions are satisfied: The slave address coincides with the second address value (Y in step S7); the action mode of the integrated circuit 100 is the second mode (N in step S8); and the electronic part 1 receives the storage access request command from the external apparatus 2 (Y in step S9), the electronic part 1 switches the action mode of the integrated circuit 100 from the second mode to the first mode (step S10). The electronic part 1 then carries out the process in step S1 and the following processes again.

When the electronic part 1 does not receive the storage access request command from the external apparatus 2 (N in step S9), the electronic part 1 does not carry out the process in step S10.

When the following conditions are satisfied: The slave address coincides with the second address value (Y in step S7); the action mode of the integrated circuit 100 is the first mode (Y in step S8); and the electronic part 1 receives a memory access request command from the external apparatus 2 (Y in step S11), the electronic part 1 switches the action mode of the integrated circuit 100 from the first mode to the second mode (step S12). The electronic part 1 then carries out the process in step S1 and the following processes again.

When the electronic part 1 does not receive the memory access request command (N in step S11) but receives the data writing request (Y in step S13) from the external apparatus 2, the electronic part 1 writes data onto the storage 130 (step S14). The electronic part 1 then carries out the process in step S1 and the following processes again.

When the electronic part 1 does not receive the data writing request (N in step S13) but receives the data reading request (Y in step S15) from the external apparatus 2, the electronic part 1 reads data from the storage 130 (step S16). The electronic part 1 then carries out the process in step S1 and the following processes again.

When the electronic part 1 does not receive the data writing request (N in step S13) and does not receive the data reading request (N in step S15), the electronic part 1 carries out the process in step S1 and the following processes again.

When the slave address does not coincide with the first address value (N in step S1), and when the slave address does not coincide with the second address value (N in step S7), the electronic part 1 carries out the process in step S1 and the following processes again.

As described above, the electronic part 1 according to the first embodiment includes the integrated circuit 100 and the memory 140, and the integrated circuit 100 includes the first clock terminal T1, to which the clock signal SCL is inputted, the first data terminal T2, to and from which the first serial data signal SDA is inputted and outputted, the second clock terminal T3, via which the clock signal SCL is outputted as the clock signal SCLM to the memory 140, and the second data terminal T4, via which the second serial data signal SDAM is inputted and outputted from and to the memory 140. The integrated circuit 100 further includes the first interface circuit 110 including the control circuit 111, which controls the communication state of the integrated circuit 100 based on the clock signal SCL and the first serial data signal SDA to be the first communication state, in which the first serial data signal SDA inputted to the first data terminal T2 is outputted as the second serial data signal SDAM via the second data terminal T4, or the second communication state, in which the second serial data signal SDAM inputted to the second data terminal T4 is outputted as the first serial data signal SDA via the first data terminal T2. The first interface circuit 110 therefore outputs the clock signal SCL and the first serial data signal SDA supplied from the external apparatus 2 as the clock signal SCLM and the second serial data signal SDAM to the memory 140 in the first communication state and outputs the clock signal SCL supplied from the external apparatus 2 as the clock signal SCLM to the memory 140 and further outputs the first serial data signal SDA supplied from the external apparatus 2 as the second serial data signal SDAM to the memory 140 in the second communication state to allow the external apparatus 2 to directly access the memory 140. Therefore, according to the electronic part 1 of the first embodiment, the external apparatus 2 can access the memory 140 even in a state in which the clock source in the integrated circuit 100 is not in operation or a state in which no clock source is implemented in the integrated circuit 100.

In the electronic part 1 according to the first embodiment, when the number of pulses of the clock signal SCL reaches a predetermined number, the control circuit 111 switches the communication state of the integrated circuit 100 from the first communication state to the second communication state. Therefore, according to the electronic part 1 of the first embodiment, the external apparatus 2 can receive the acknowledgement bit from the memory 140 and data read from the memory 140 via the first interface circuit 110.

In the electronic part 1 according to the first embodiment, the method of communication between the external apparatus 2 and the first interface circuit 110 based on the clock signal SCL and the first serial data signal SDA is the same as the method of communication between the first interface circuit 110 and the memory 140 based on the clock signal SCLM and the second serial data signal SDAM. Therefore, according to the electronic part 1 of the first embodiment, the first interface circuit 110 needs no data format conversion between the first serial data signal SDA and the second serial data signal SDAM.

In the electronic part 1 according to the first embodiment, the integrated circuit 100 includes the storage 130 and the second interface circuit 120, which controls the writing and reading of data to and from the storage 130 based on the clock signal SCL and the first serial data signal SDA. Therefore, according to the electronic part 1 of the first embodiment, the external apparatus 2 can write and read data to and from the storage 130 via the second interface circuit 120.

In the electronic part 1 according to the first embodiment, the second interface circuit 120 switches the action mode of the integrated circuit 100 based on the clock signal SCL and the first serial data signal SDA from the first mode, which permits no access to the memory 140 via the first interface circuit 110, to the second mode, which permits access to the memory 140 via the first interface circuit 110, and the first interface circuit 110 controls writing and reading of data to and from the memory 140 in the second mode by causing the control circuit 111 to control the communication state of the integrated circuit 100 to be the first or second communication state. Therefore, according to the electronic part 1 of the first embodiment, the external apparatus 2 can write and read data to and from the memory 140 via the first interface circuit 110 in the second mode and can write and read data to and from the storage 130 via the second interface circuit 120 in the first mode.

1-2. Second Embodiment

The electronic part 1 according to a second embodiment will be described below primarily about contents different from those in the first embodiment with configurations similar to those in the first embodiment having the same reference characters and descriptions similar to those in the first embodiment omitted or simplified.

Figure 5:
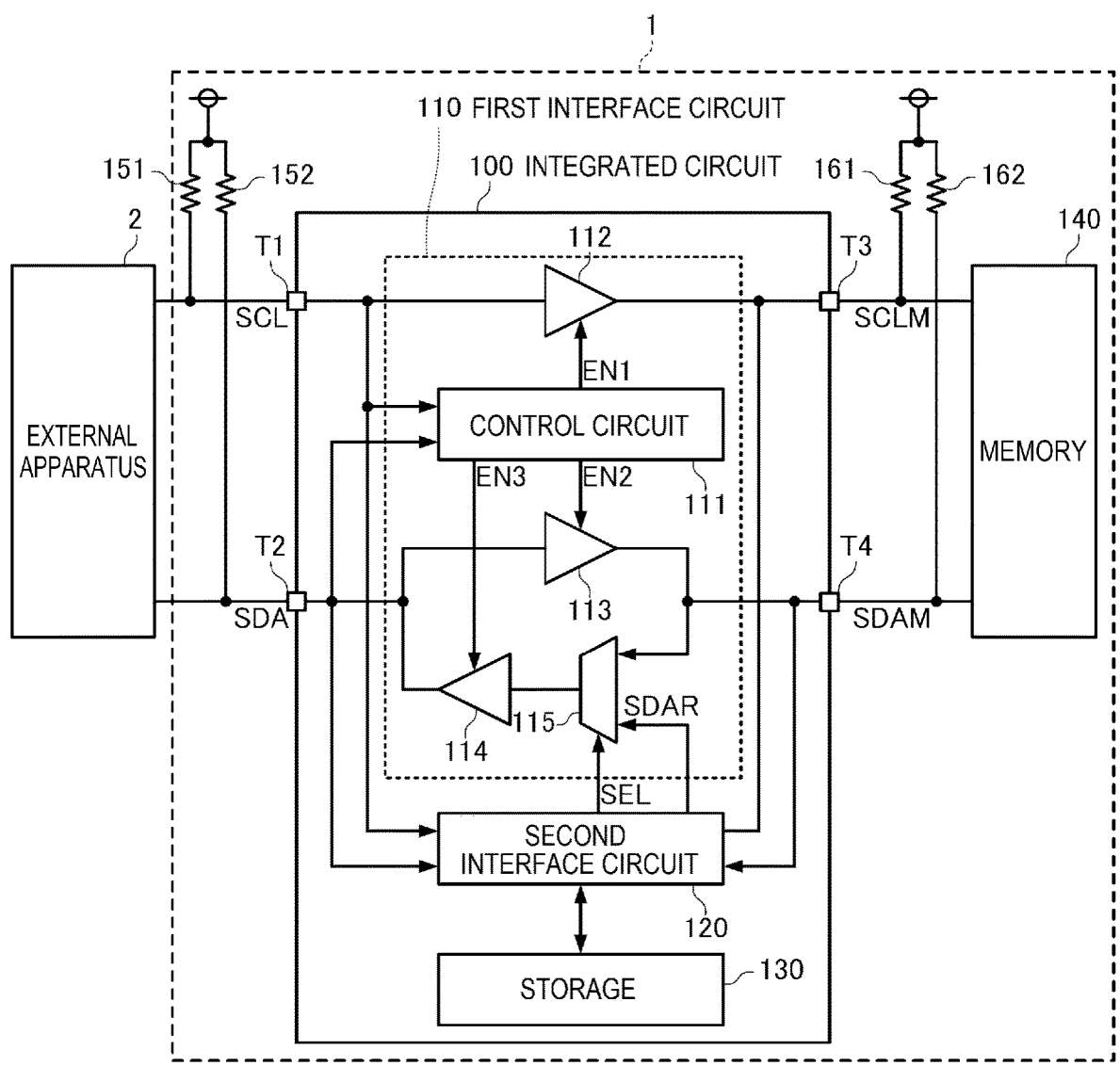
FIG. 5 shows an example of the configuration of an electronic part according to a second embodiment.

FIG. 5 shows an example of the configuration of the electronic part according to the second embodiment. The electronic part 1 according to the second embodiment includes the integrated circuit 100 and the memory 140, as does the electronic part 1 according to the first embodiment, and may further include the resistive elements 151, 152, 161, and 162, as shown in FIG. 5. The memory 140 and the resistive elements 151, 152, 161, and 162 have the same functions as those in the first embodiment and will therefore not be described.

The integrated circuit 100 includes the first clock terminal T1, the first data terminal T2, the second clock terminal T3, the second data terminal T4, the first interface circuit 110, and the second interface circuit 120, and the storage 130, as in the electronic part 1 according to the first embodiment. The storage 130 has the same function as that in the first embodiment and will therefore not be described.

The first interface circuit 110 includes the control circuit 111 and the buffers 112, 113, and 114, as in the electronic part 1 according to the first embodiment. In the electronic part 1 according to the second embodiment, the first interface circuit 110 further includes a selector 115. The buffers 112 and 113 have the same functions as those in the first embodiment and will therefore not be described.

The selector 115 receives the second serial data signal SDAM and a third serial data signal SDAR as inputs and outputs the second serial data signal SDAM or the third serial data signal SDAR selected in accordance with the logical level of a selection signal SEL. Specifically, the selector 115 selects and outputs the second serial data signal SDAM when the selection signal SEL has the low level and selects and outputs the third serial data signal SDAR when the selection signal SEL has the high level.

Also in the second embodiment, the control circuit 111 controls the state of communication performed by the integrated circuit 100 to be the first or second communication state described above based on the clock signal SCL and the first serial data signal SDA also in the second embodiment, as in the first embodiment.

The method of communication performed by the first interface circuit 110 via the first clock terminal T1 and the first data terminal T2 is the same as the method of communication performed between the first interface circuit 110 and the memory 140 via the second clock terminal T3 and the second data terminal T4. In other words, the method of communication between the external apparatus 2 and the first interface circuit 110 based on the clock signal SCL and the first serial data signal SDA is the same as the method of communication between the first interface circuit 110 and the memory 140 based on the clock signal SCLM and the second serial data signal SDAM. Specifically, also in the second embodiment, the method of communication between the external apparatus 2 and the first interface circuit 110 and the method of communication between the first interface circuit 110 and the memory 140 each comply with the I²C scheme, as in the first embodiment.

The second interface circuit 120 controls writing and reading of data performed by the external apparatus 2 to and from the storage 130 based on the clock signal SCL and the first serial data signal SDA. Also in the second embodiment, the method of communication between the external apparatus 2 and the second interface circuit 120 complies with the I²C scheme, as do the method of communication between the external apparatus 2 and the first interface circuit 110 and the method of communication between the first interface circuit 110 and the memory 140, as in the first embodiment.

When the electronic part 1 is powered on, the second interface circuit 120 produces the clock signal SCLM and the second serial data signal SDAM for reading a variety of data stored in the memory 140 and loads the variety of data read from the memory 140 into the variety of registers of the storage 130. Each circuit of the integrated circuit 100 is thus set in a desired state.

Also in the second embodiment, the first address value is allocated to the memory 140, and the second address value different from the first address value is allocated to the integrated circuit 100, as in the first embodiment. When the slave address contained in the first serial data signal SDA has the first address value, the second interface circuit 120 outputs a low-level selection signal SEL, whereas when the slave address has the second address value, the second interface circuit 120 outputs a high-level selection signal SEL.

The buffer 114 is a buffer to which an output signal from the selector 115 is inputted and which outputs the low-level signal or has the high-impedance output in accordance with the logical level of the enable signal EN3 and the logical level of the output signal from the selector 115. Specifically, the buffer 114 has the high-impedance output when the enable signal EN3 has the low level, outputs the low-level signal when the enable signal EN3 has the high level and the output signal from the selector 115 has the low level, and has the high-impedance output when the output signal from the selector 115 has the high level.

When the slave address contained in the first serial data signal SDA has the first address value, the first interface circuit 110 controls writing and reading of data to and from the memory 140 by controlling the communication state of the integrated circuit 100 to be the first or second communication state. When the slave address contained in the first serial data signal SDA has the second address value, the second interface circuit 120 controls writing and reading of data to and from the storage 130 performed by the external apparatus 2.

In the present embodiment, after the electronic part 1 is powered on, the control circuit 111 first controls the communication state of the integrated circuit 100 to be the first communication state. Specifically, the control circuit 111 sets the level of each of the enable signals EN1 and EN2 at the high level and sets the level of the enable signal EN3 at the low level. As a result, the buffer 112 outputs the low-level signal or has the high-impedance output in accordance with the logical level of the clock signal SCL, and the clock signal SCLM has the same logical level as that of the clock signal SCL. The buffer 113 outputs the low-level signal or has the high-impedance output in accordance with the logical level of the first serial data signal SDA, and the second serial data signal SDAM has the same logical level as that of the first serial data signal SDA. The buffer 114 has the high-impedance output. The control circuit 111 thus controls the communication state of the integrated circuit 100 to be the first communication state.

Also in the second embodiment, when the number of pulses of the clock signal SCL reaches a predetermined number, the control circuit 111 switches the communication state of the integrated circuit 100 from the first communication state to the second communication state in accordance with a predetermined communication method, as in the first embodiment. Specifically, when the number of pulses of the clock signal SCL reaches the predetermined number, the control circuit 111 maintains the enable signal EN1 at the high level, changes the level of the enable signal EN2 from the high level to the low level, and changes the level of the enable signal EN3 from the low level to the high level. As a result, the buffer 112 outputs the low-level signal or has the high-impedance output in accordance with the logical level of the clock signal SCL, and the clock signal SCLM has the same logical level as that of the clock signal SCL. The buffer 113 has the high-impedance output. The buffer 114 outputs the low-level signal or has the high-impedance output in accordance with the logical level of the output signal from the selector 115, and the first serial data signal SDA has the same logical level as that of the output signal from the selector 115. The control circuit 111 thus controls the communication state of the integrated circuit 100 to be the second communication state.

The control circuit 111 then also controls the communication state of the integrated circuit 100 to be the first or second communication state until the communication ends in accordance with the predetermined communication method based on the number of pulses of the clock signal SCL. The control circuit 111 thus switches the communication state between the first communication state and the second communication state based on the number of pulses of the clock signal SCL.

Also in the present embodiment, examples of the waveforms of a variety of signals used when the external apparatus 2 writes data onto the memory 140 by performing the I²C communication are the same as those in FIG. 2, and the illustration and description thereof will be omitted. Further, examples of the waveforms of a variety of signals used when the external apparatus 2 reads data from the memory 140 by performing the I²C communication are the same as those in FIG. 3, and the illustration and description thereof will be omitted.

Figure 6:
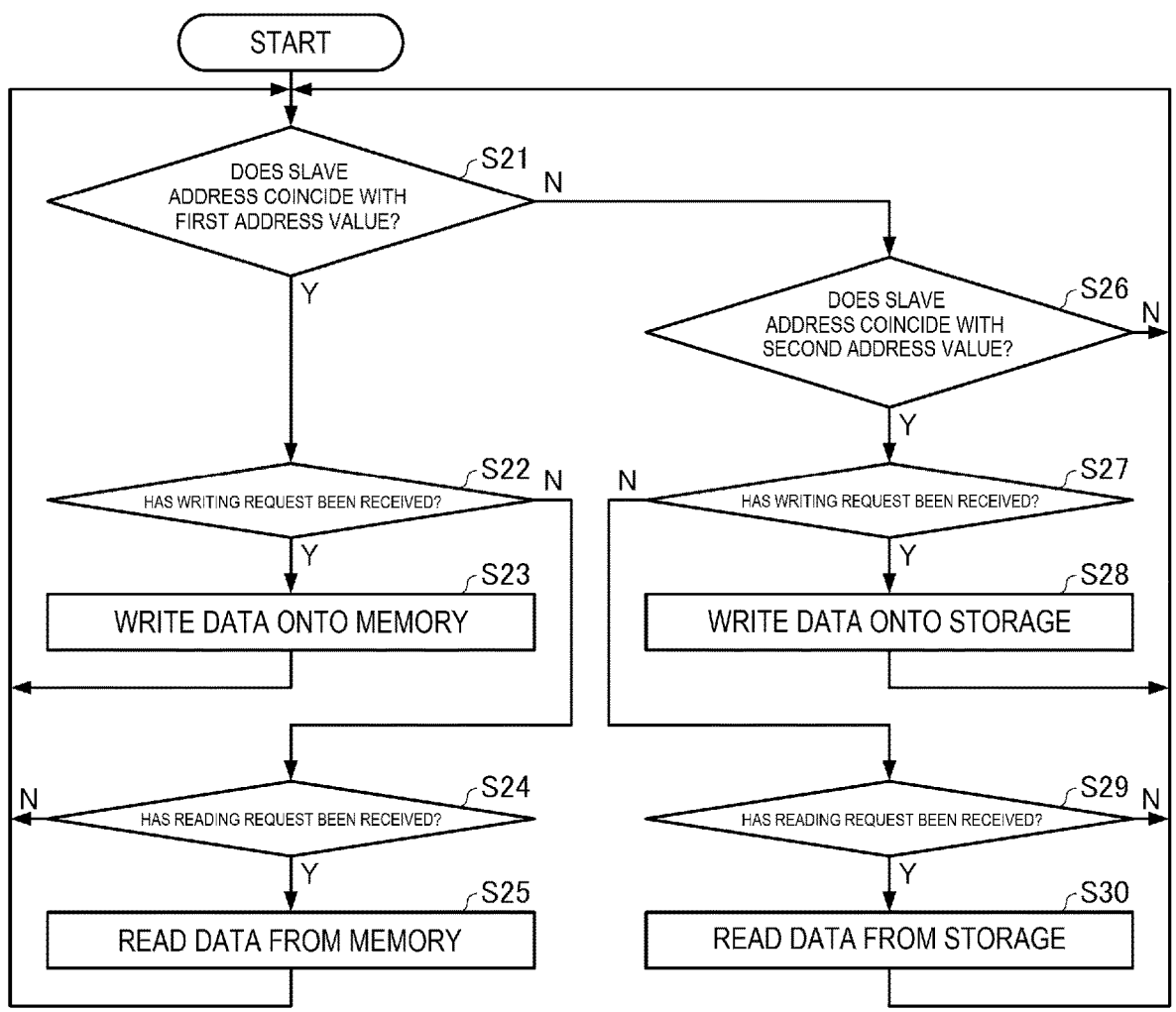
FIG. 6 is a flowchart showing an example of the procedure of processes carried out by the electronic part according to the second embodiment.

FIG. 6 is a flowchart showing an example of the procedure of processes carried out by the electronic part 1 according to the second embodiment.

In the example shown in FIG. 6, the electronic part 1 first evaluates whether or not the slave address contained in the first serial data signal SDA coincides with the first address value (step S21).

When the slave address coincides with the first address value (Y in step S21), and the electronic part 1 receives the data writing request from the external apparatus 2 (Y in step S22), the electronic part 1 writes data onto the memory 140 (step S23). The electronic part 1 then carries out the process in step S21 and the following processes again.

When the electronic part 1 does not receive the data writing request (N in step S22) but receives the data reading request (Y in step S24), the electronic part 1 reads data from the memory 140 (step S25). The electronic part 1 then carries out the process in step S21 and the following processes again.

When the electronic part 1 does not receive the data writing request (N in step S22) and does not receive the data reading request (N in step S24), the electronic part 1 carries out the process in step S21 and the following processes again.

When the slave address does not coincide with the first address value (N in step S21), the electronic part 1 evaluates whether or not the slave address coincides with the second address value (step S26).

When the slave address coincides with the second address value (Y in step S26), and the electronic part 1 receives the data writing request from the external apparatus 2 (Y in step S27), the electronic part 1 writes data onto the storage 130 (step S28). The electronic part 1 then carries out the process in step S21 and the following processes again.

When the electronic part 1 does not receive the data writing request (N in step S27) but receives the data reading request (Y in step S29) from the external apparatus 2, the electronic part 1 reads data from the storage 130 (step S30). The electronic part 1 then carries out the process in step S21 and the following processes again.

When the electronic part 1 does not receive the data writing request (N in step S27) and does not receive the data reading request (N in step S29), the electronic part 1 carries out the process in step S21 and the following processes again.

When the slave address does not coincide with the first address value (N in step S21), and when the slave address does not coincide with the second address value (N in step S26), the electronic part 1 carries out the process in step S21 and the following processes again.

As described above, in the electronic part 1 according to the second embodiment, when the slave address contained in the first serial data signal SDA has the first address value allocated to the memory 140, the control circuit 111 of the first interface circuit 110 controls writing and reading of data to and from the memory 140 by controlling the communication state of the integrated circuit 100 to be the first or second communication state, and the second interface circuit 120 controls writing and reading of data to and from the storage 130 when the slave address has the second address value allocated to the integrated circuit 100. Therefore, according to the electronic part 1 of the second embodiment, the external apparatus 2 can select in accordance with the slave address, whether the external apparatus 2 writes and reads data to and from the memory 140 via the first interface circuit 110 or writes and reads data to and from the storage 130 via the second interface circuit 120.

According to the electronic part 1 of the second embodiment, to allow the external apparatus 2 to access the memory 140, the second interface circuit 120 does not need to switch the action mode of the integrated circuit 100 from the first mode to the second mode based on the clock signal SCL and the first serial data signal SDA, unlike the electronic part 1 according to the first embodiment, whereby the external apparatus 2 can readily access the memory 140, and the size of the integrated circuit 100 can be reduced, as compared with the electronic part 1 according to the first embodiment.

In addition, the electronic part 1 according to the second embodiment can provide the same effects as those provided by the electronic part 1 according to the first embodiment.

1-3. Specific Examples

Figure 7:
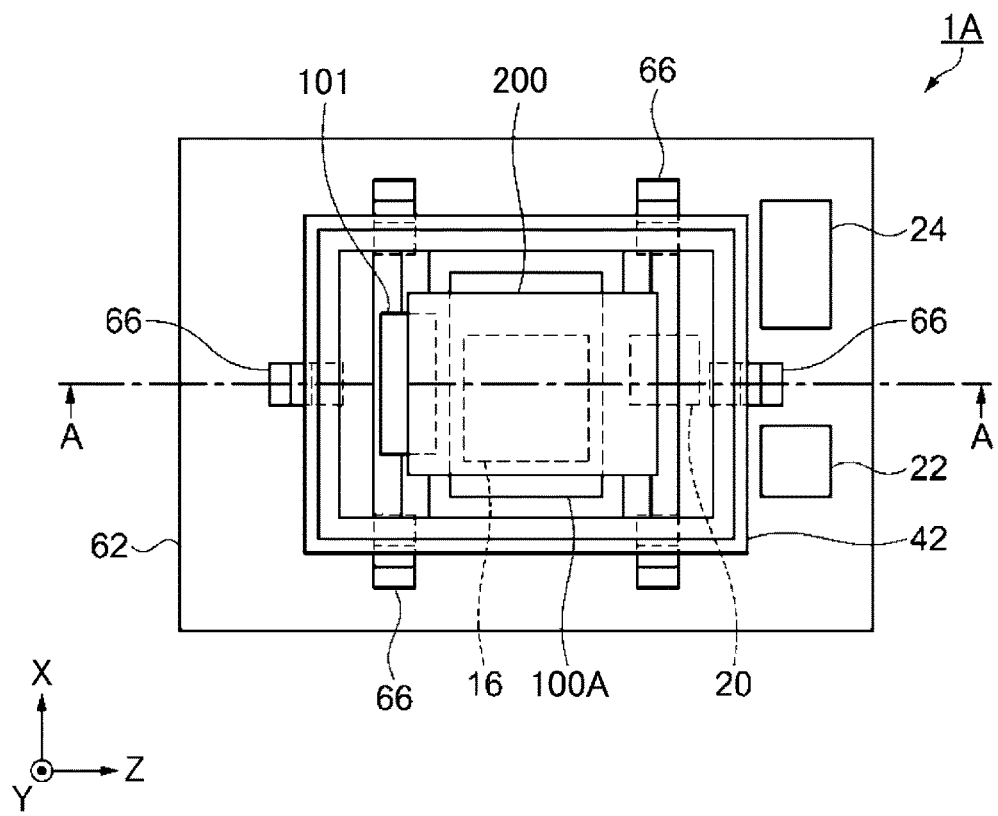
FIG. 7 is a plan view of an oscillator.
Figure 8:
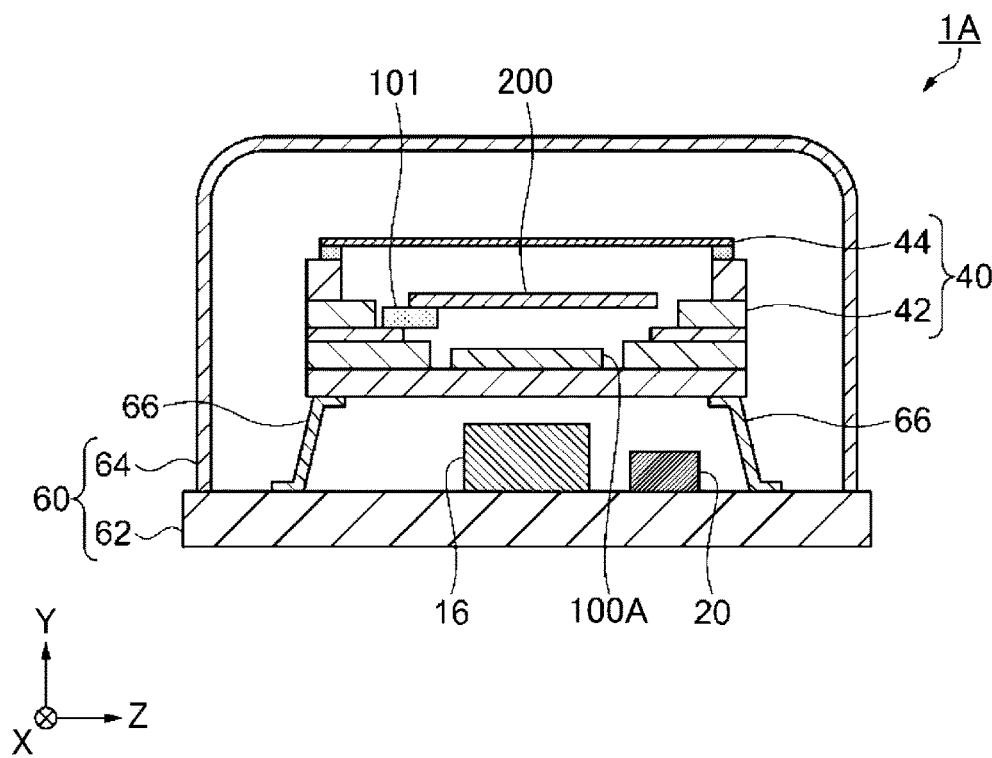
FIG. 8 is a cross-sectional view of the oscillator.
Figure 9:
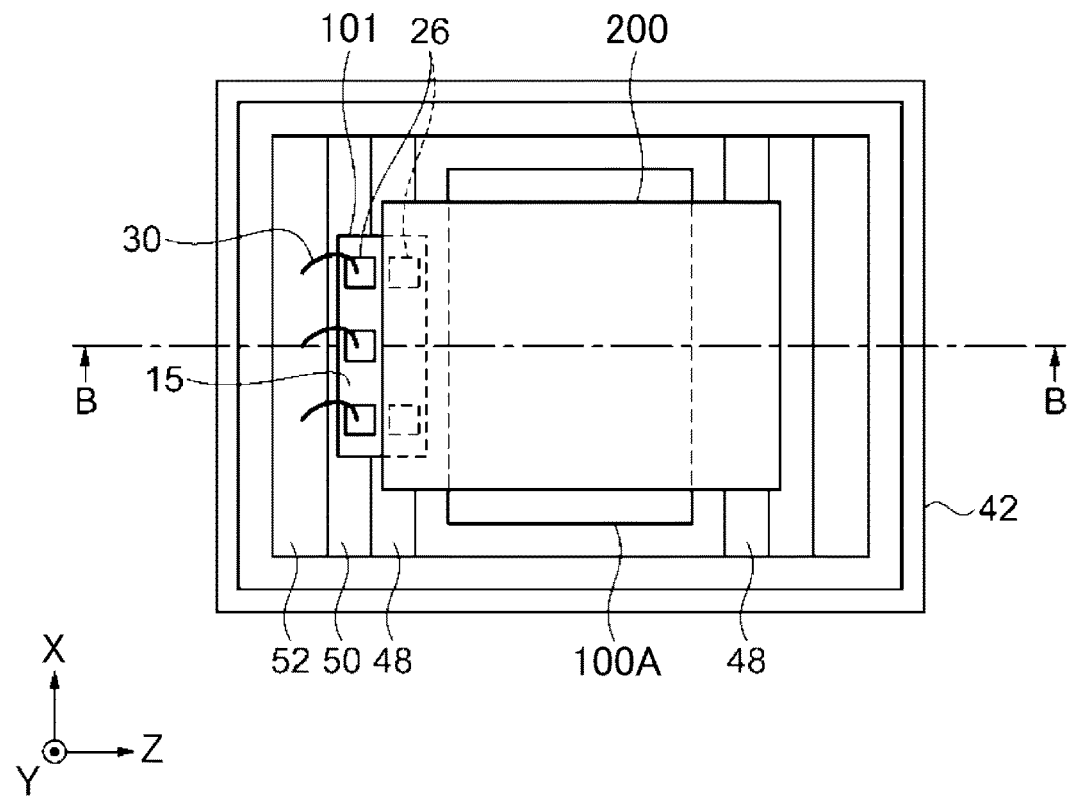
FIG. 9 is a plan view of a container that forms the oscillator.
Figure 10:
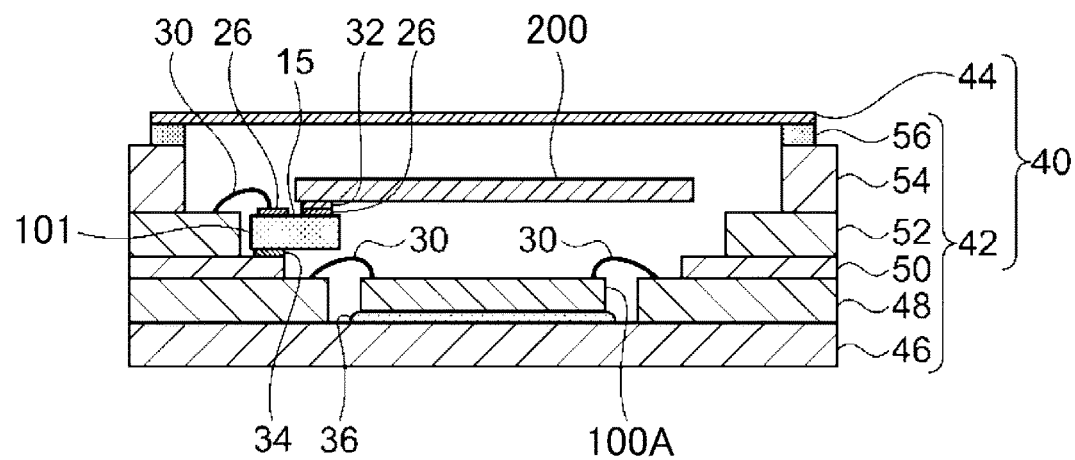
FIG. 10 is a cross-sectional view of the container that forms the oscillator.

FIGS. 7 and 8 show the structure of an oscillator 1A, which is an example of the electronic part 1 according to any of the embodiments of the present disclosure. FIG. 7 is a plan view of the oscillator 1A, and FIG. 8 is a cross-sectional view of the oscillator 1 taken along the line A-A shown in FIG. 7. FIGS. 9 and 10 are schematic configuration diagrams of a container 40, which forms the oscillator 1A. FIG. 9 is a plan view of the container 40, which forms the oscillator 1A, and FIG. 10 is a cross-sectional view of the container 40 taken along the line B-B shown in FIG. 9. FIGS. 7 and 9 show a state in which a cover 64 and a lid member 44 are removed for convenience of description of the internal configurations of the oscillator 1A and the container 40. FIGS. 7 to 10 further show an X axis, a Y axis, and a Z axis as three axes perpendicular to one another for convenience of description. Further, the following definition is made for convenience of description: in a plan view viewed along the axis-Y direction, a surface facing the positive side of the axis-Y direction is an upper surface; and a surface facing the negative side of the axis-Y direction is a lower surface. It is noted that wiring patterns and electrode pads formed on the upper surface of a base substrate 62, connection terminals formed on the outer surface of the container 40, and wiring patterns and electrode pads formed in the container 40 are omitted.

The oscillator 1A includes a vibrator 200, the container 40, which accommodates an integrated circuit 100A including an oscillation circuit and an integrated circuit 101 including a temperature adjuster, and a circuit element 16, which is located outside the container 40 and disposed on the upper surface of the base substrate 62. The vibrator 200 may, for example, be an SC-cut quartz crystal vibrator. An SC-cut quartz crystal vibrator excels in frequency stability because it has low external stress sensitivity.

The container 40 is so disposed on the upper surface of the base substrate 62 of the oscillator 1A as to be separate from the base substrate 62 via a lead frame 66, and circuit parts 20, 22, and 24, such as a plurality of capacitors and resistors, are disposed on the upper surface of the base substrate 62. Further, the container 40 and the circuit element 16 are covered with a cover 64 and accommodated in a container 60. The interior of the container 60 is hermetically sealed and filled with a reduced-pressure atmosphere, such as a vacuum, or an inert gas atmosphere, such as nitrogen, argon, and helium.

The circuit element 16 and circuit parts 20, 22, and 24, which adjust the oscillator 200 or the oscillation circuit and other components provided in the integrated circuit 100A, are located outside the container 40, which accommodates the integrated circuit 101. Heat generated by the temperature adjuster provided in the integrated circuit 101A therefore does not cause a resin member that forms the circuit element 16 and solder, electrically conductive adhesive, and other materials that are connection members that couples the circuit element 16 and the circuit parts 20, 22, and 24 to the container 40 to produce a gas. Further, even if a gas is produced, the gas does not affect the vibrator 200 because the vibrator 200 is accommodated in the container 40, whereby the vibrator 200 maintains stable frequency characteristics, and the oscillator 1A has high frequency stability.

The container 40 accommodates the integrated circuit 100A, the integrated circuit 101, and the vibrator 200 disposed on the upper surface of the integrated circuit 101, as shown in FIGS. 9 and 10. The interior of the container 40 is hermetically sealed and filled with a reduced-pressure atmosphere, such as a vacuum, or an inert gas atmosphere, such as nitrogen, argon, and helium.

The container 40 is formed of a package main body 42 and a lid member 44. The package main body 42 is formed by layering a first substrate 46, a second substrate 48, a third substrate 50, a fourth substrate 52, and a fifth substrate 54 on each other, as shown in FIG. 10. The second substrate 48, the third substrate 50, the fourth substrate 52, and the fifth substrate 54 are each an annular element with a central portion removed, and a sealing member 56, such as a seal ring and a low-melting-point glass plate, is formed along the circumferential edge of the upper surface of the fifth substrate 54.

The second substrate 48 and the third substrate 50 form a recess that accommodates the integrated circuit 100A, and the fourth substrate 52 and the fifth substrate 54 form a recess that accommodates the integrated circuit 101.

The integrated circuit 100A is bonded to the upper surface of the first substrate 46 in a predetermined position via a bonding member 36, and the integrated circuit 100A is electrically coupled to electrode pads that are not shown but are disposed on the upper surface of the second substrate 48 via bonding wires 30.

The integrated circuit 101 is bonded to the upper surface of the third substrate 50 in a predetermined position via a bonding member 34, and electrode pads 26 formed on an active surface 15, which is the upper surface of the integrated circuit 101, are electrically coupled to electrode pads that are not shown but are disposed on the upper surface of the fourth substrate 52 via bonding wires 30.

Therefore, since the integrated circuit 100A and the integrated circuit 101 are so disposed as to be separate from each other in the container 40, heat generated by the integrated circuit 101, which heats the vibrator 200, is unlikely to directly reach the integrated circuit 100A. Degradation in the characteristics of the oscillation circuit provided in the integrated circuit 100A due to overheating can therefore be controlled.

The vibrator 200 is disposed on the active surface 15 of the integrated circuit 101. The vibrator 200 is bonded to the integrated circuit 101 in such a way that the electrode pad 26 formed on the active surface 15 is bonded to an electrode pad that is not shown but is formed on the lower surface of the vibrator 200 via a bonding member 32, such as metal bumps and an electrically conductive adhesive. The vibrator 200 is thus supported by the integrated circuit 101. Excitation electrodes that are not shown but are formed on the upper and lower surfaces of the vibrator 200 are electrically coupled to the electrode pad that is not shown but is formed on the lower surface of the vibrator 200. The vibrator 200 and the integrated circuit 101 only need to be so coupled to each other that the heat generated by the integrated circuit 101 is transferred to the vibrator 200. Therefore, for example, the vibrator 200 may be coupled to the integrated circuit 101 via a non-electrically-conductive bonding member, and the vibrator 200 may be electrically coupled to the integrated circuit 101 or the package main body 42 via electrically conductive members, such as bonding wires.

Therefore, since the vibrator 200 is disposed on the integrated circuit 101, the heat from the integrated circuit 101 can be transferred to the vibrator 200 with no loss, whereby the temperature of the vibrator 200 can be more stably controlled with a small amount of power consumption.

In FIG. 7, the vibrator 200 has a rectangular shape in the plan view viewed along the axis-Y direction. The vibrator 200 does not necessarily have a rectangular shape and may instead have, for example, a circular shape. The vibrator 200 is not limited to an SC-cut quartz crystal vibrator and may instead be an AT-cut quartz crystal vibrator, a tuning-fork-type quartz crystal vibrator, a surface acoustic wave resonance element, or any other piezoelectric vibrator, or a MEMS (micro electro mechanical systems) resonator. When an AT-cut quartz crystal vibrator is used as the vibrator 200, a B-mode suppression circuit is unnecessary, whereby the size of the oscillator 1A can be reduced.

Figure 11:
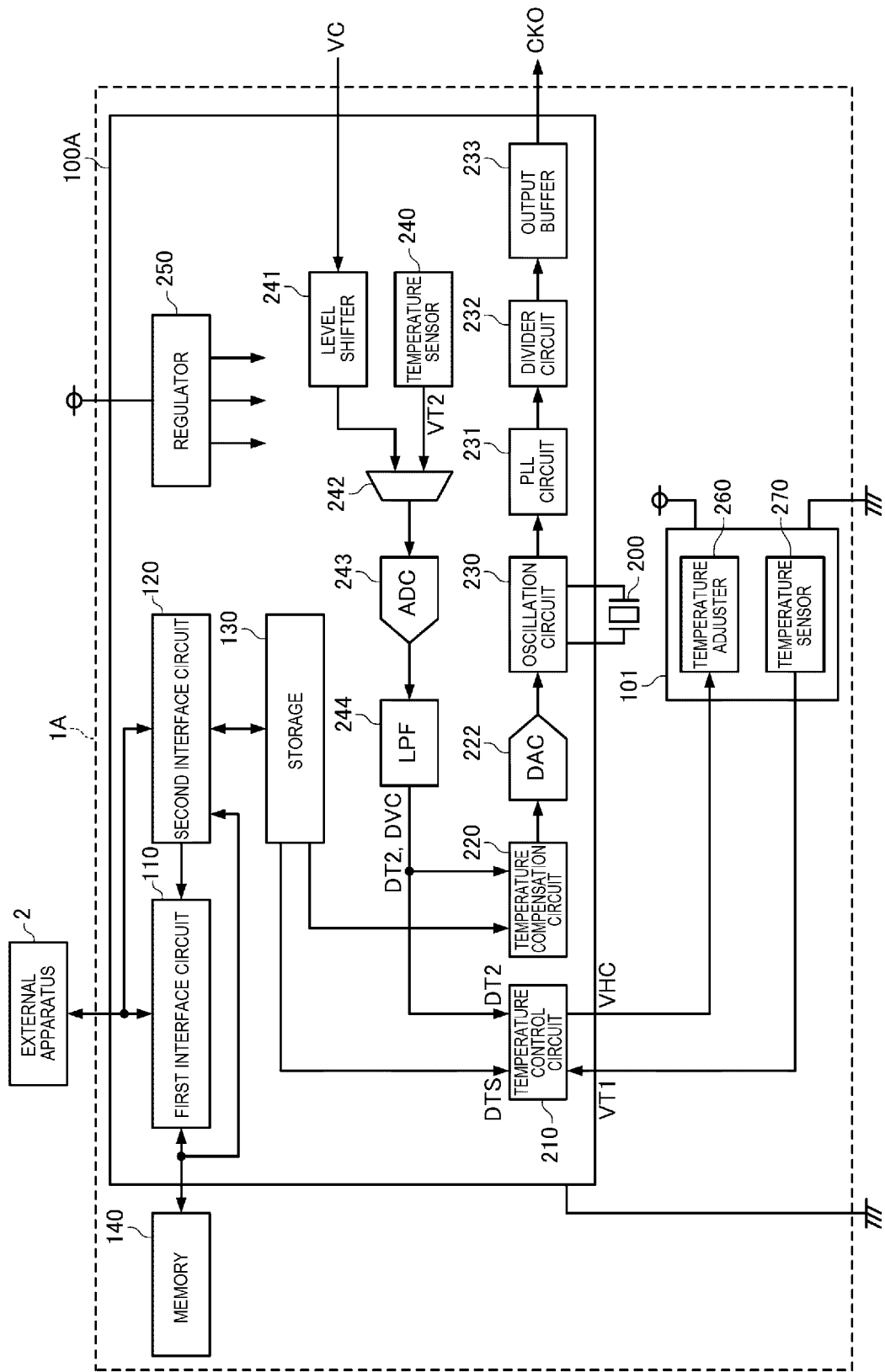
FIG. 11 is a functional block diagram of the oscillator.

FIG. 11 is a functional block diagram of the oscillator 1A. The oscillator 1A includes the vibrator 200, the integrated circuit 100A, and the integrated circuit 101, as shown in FIG. 11.

The integrated circuit 101 includes a temperature adjuster 260 and a temperature sensor 270.

The temperature adjuster 260 is an element that adjusts the temperature of the vibrator 200 and is, for example, a heat generator. The heat generated by the temperature adjuster 260 is controlled in accordance with a temperature control signal VHC supplied from the integrated circuit 100A. Since the vibrator 200 is bonded to the integrated circuit 101, as described above, the heat generated by the temperature adjuster 260 is transferred to the vibrator 200, so that the temperature of the vibrator 200 is so adjusted as to approach a desired fixed temperature.

The temperature sensor 270 detects the temperature of the integrated circuit 101 and outputs a first temperature detection signal VT1 having a voltage level according to the detected temperature. Since the vibrator 200 is bonded to the integrated circuit 101, as described above, and the temperature sensor 270 is located in the vicinity of the vibrator 200, the temperature sensor 270 detects the temperature in a region around the vibrator 200. Since the temperature sensor 270 is located in the vicinity of the temperature adjuster 260, it can be said that the temperature sensor 270 detects the temperature of the temperature adjuster 260. The first temperature detection signal VT1 outputted from the temperature sensor 270 is supplied to the integrated circuit 100A.

The integrated circuit 100A, which is an example of the integrated circuit 100 described above, includes the first interface circuit 110, the second interface circuit 120, the storage 130, a temperature control circuit 210, a temperature compensation circuit 220, a D/A conversion circuit 222, an oscillation circuit 230, a phase locked loop (PLL) circuit 231, a divider circuit 232, an output buffer 233, a temperature sensor 240, a level shifter 241, a selector 242, an A/D conversion circuit 243, a lowpass filter 244, and a regulator 250.

The first interface circuit 110 controls writing and reading of data to and from the memory 140 of the oscillator 1A performed by the external apparatus 2, as described above. For example, the first interface circuit 110 is achieved by a circuit shown in FIG. 1 or 5.

The second interface circuit 120 controls writing and reading of data to and from the storage 130 performed by the external apparatus 2, as described above. When the electronic part 1 is powered on, or when the second interface circuit 120 receives the reloading command from the external apparatus 2, the second interface circuit 120 loads a variety of data written onto the memory 140 to the registers provided in the storage 130. Each circuit of the integrated circuit 100A is thus initialized to a desired state.

The method of communication between the external apparatus 2 and the first interface circuit 110 and the method of communication between the first interface circuit 110 and the memory 140 each comply with the I²C scheme. In FIG. 11, the resistive elements 151, 152, 161, and 162 shown in FIG. 1 or 5 are omitted.

The storage 130 includes a variety of registers, such as a register that stores a variety of data for controlling the action of each circuit of the integrated circuit 100A or the oscillator 1A, as described above. In an inspection step at the time of manufacture of the oscillator 1A, the external apparatus 2, which is an inspection apparatus, writes a variety of data for controlling the action of each circuit provided in the oscillator 1A onto the memory 140 via the first interface circuit 110 to adjust the circuit. When the oscillator 1A is powered on, the variety of data stored in the memory 140 are transferred to and held in the variety of registers provided in the register group via the second interface circuit 120, and the variety of data held in the variety of registers are supplied to each circuit of the oscillator 1A.

The regulator 250 produces power supply voltage and reference voltage for each circuit provided in the integrated circuit 100A based on power supply voltage supplied from component external to the integrated circuit 100A.

The temperature sensor 240 detects the temperature of the integrated circuit 100A and outputs a second temperature detection signal VT2 having a voltage level according to the detected temperature. The integrated circuit 100A is bonded to the upper surface of the first substrate 46, as described above, and the temperature sensor 240 is located in a position separate from the vibrator 200 and the temperature adjuster 260 by a greater amount than the temperature sensor 270. The temperature sensor 270 therefore detects the temperature in a position in the container 40 that is a position separate from the vibrator 200 and the temperature adjuster 260. Further, ambient heat is transferred to the container 40 via the lead frame 66. Therefore, when the temperature outside the oscillator 1A changes over a predetermined range, the temperature detected with the temperature sensor 270, which is provided in the vicinity of the temperature adjuster 260, hardly changes, whereas the temperature detected with the temperature sensor 240 changes over the predetermined range.

The level shifter 241 converts the voltage level of a frequency control signal VC supplied from a component external to the oscillator 1A into a desired voltage level.

The selector 242 selects and outputs one of the frequency control signal VC outputted from the level shifter 241 and the second temperature detection signal VT2 outputted from the temperature sensor 240. For example, the selector 242 selects one of the frequency control signal VC and the second temperature detection signal VT2 in a time division manner and outputs the selected signal. It is, however, noted that, for example, in the inspection step at the time of manufacture of the oscillator 1A, a selection value for selecting one of the frequency control signal VC and the second temperature detection signal VT2 may be stored in the memory 140 in accordance with the specifications of the oscillator 1A, and when the oscillator 1A is powered on, the selection value may be transferred from the memory 140 to a predetermined register that is not shown but is provided in the storage 130 via the second interface circuit 120 and held in the register, and the selection value held in the register may be supplied to the selector 242.

The A/D conversion circuit 243 converts the frequency control signal VC and the second temperature detection signal VT2, which are each an analog signal outputted from the selector 242 in a time division manner, into a frequency control value DVC and a second temperature detection value DT2, which are each a digital signal.

The lowpass filter 244 is a digital filter that performs lowpass filtering on the frequency control value DVC and the second temperature detection value DT2 outputted from the A/D conversion circuit 243 in a time division manner to lower the intensity of a high-frequency noise signal.

The temperature control circuit 210 produces the temperature control signal VHC, which controls the temperature adjuster 260, based on a temperature setting value DTS for the vibrator 200, the first temperature detection signal VT1, and the second temperature detection value DT2. The temperature setting value DTS is a value that sets a target temperature of the vibrator 200 and is stored in the memory 140. For example, in the inspection step at the time of manufacture of the oscillator 1A, a temperature setting value DTS that minimizes a change in the frequency with a change in temperature is produced and stored in the memory 140. When the oscillator 1A is powered on, the temperature setting value DTS is transferred from the memory 140 to a predetermined register that is not shown but is provided in the storage 130 via the second interface circuit 120 and held in the predetermined register, and the temperature setting value DTS held in the register is supplied to the temperature control circuit 210.

The temperature compensation circuit 220 performs temperature compensation on the frequency of the oscillation circuit 230 based on the second temperature detection value DT2. Specifically, the temperature compensation circuit 220 produces a temperature compensation value that is a digital signal for performing the temperature compensation based on the second temperature detection value DT2 in such a way that the frequency of the oscillation circuit 230 is a desired frequency according to the frequency control value DVC. For example, in the inspection step at the time of manufacture of the oscillator 1A, the temperature compensation circuit 220 produces temperature compensation data for producing a temperature compensation value that achieves frequency-temperature characteristics substantially opposite the characteristics of the vibrator 200 and stores the temperature compensation data in the memory 140. When the oscillator 1A is powered on, the temperature compensation data is transferred from the memory 140 to a predetermined register that is not shown but is provided in the storage 130 via the second interface circuit 120, and the temperature compensation data is held in the predetermined register. The temperature compensation circuit 220 then produces the temperature compensation value based on the temperature compensation data held in the register, the second temperature detection value DT2, and the frequency control value DVC.

The D/A conversion circuit 222 converts the temperature compensation value produced by the temperature compensation circuit 220 into temperature compensation voltage that is an analog signal and supplies the oscillation circuit 230 with the temperature compensation voltage.

The oscillation circuit 230 is a circuit electrically coupled to the opposite ends of the vibrator 200, and the oscillation circuit 230 amplifies an output signal from the vibrator 200 and feeds back the amplified signal to the vibrator 200 to cause the vibrator 200 to oscillate. For example, the oscillation circuit 230 may be an oscillation circuit using an inverter as the amplifier or an oscillation circuit using a bipolar transistor as the amplifier. The oscillation circuit 230 causes the vibrator 200 to oscillate at the frequency according to the temperature compensation voltage supplied from the D/A conversion circuit 222. Specifically, the oscillation circuit 230 includes a variable capacity element that is not shown but serves as load capacity of the vibrator 200, and when the temperature compensation voltage is applied to the variable capacity element so that a load capacity value according to the temperature compensation voltage is achieved, an oscillation signal outputted from the oscillation circuit 230 has a temperature-compensated frequency.

The PLL circuit 231 multiplies the oscillation signal outputted from the oscillation circuit 230 by an integer.

The divider circuit 232 divides the oscillation signal outputted from the PLL circuit 231 by an integer.

The output buffer 233 buffers the oscillation signal outputted from the divider circuit 232 and outputs the buffered signal as an oscillation signal CKO to a component external to the integrated circuit 100A. The oscillation signal CKO is an output signal from the oscillator 1A.

To minimize a deviation of the frequency of the oscillation signal CKO, in the inspection step at the time of manufacture of the oscillator 1A, it is in particular necessary to optimize the temperature setting value DTS and the temperature compensation data stored in the memory 140. For example, in the inspection step, the temperature setting value DTS and the temperature compensation data are coarsely so adjusted that the deviation of the frequency of the oscillation signal CKO falls within a desired range, and the adjusted values are written onto the memory 140. Further, in this state, the temperature setting value DTS and the temperature compensation data undergo fine adjustment in such a way that the deviation of the frequency of the oscillation signal CKO is minimized, and the adjusted values overwrite the values stored in the memory 140. In this process, when the fine adjustment of the temperature setting value DTS to an optimized value causes the deviation of the frequency of the oscillation signal CKO not to be minimized, the temperature compensation data is caused to undergo the fine adjustment again to optimum data, which then overwrites the data stored in the memory 140. Similarly, when the fine adjustment of the temperature compensation data to optimum data causes the deviation of the frequency of the oscillation signal CKO not to be minimized, the temperature setting value DTS is caused to undergo the fine adjustment again to an optimum value, which then overwrites the value stored in the memory 140.

As described above, in the oscillator 1A, a value or data is written at the same address in the memory 140 multiple times. To this end, the memory 140 is a nonvolatile memory that allows multiple writing actions, for example, an EEPROM. Since a nonvolatile memory that allows multiple writing actions has a large size, it is difficult to implement such a memory in the integrated circuit 100A, and the memory 140 is so provided as to be a component separate from the integrated circuit 100A.

In the oscillator 1A in a state in which no vibrator 200 is implemented or in a state in which the oscillation circuit 230 is not oscillating, no internal clock signal is produced in the integrated circuit 100A, but the first interface circuit 110 needs no internal clock signal. Therefore, according to the oscillator 1A, the external apparatus 2 can write and read data to and from the memory 140 via the first interface circuit 110.

1-4. Variations

In the embodiments described above, the method of communication between the external apparatus 2 and the first interface circuit 110 and the method of communication between the first interface circuit 110 and the memory 140 are each the I²C scheme using two lines and may instead be a communication method using three lines. Signals used in a communication method using three lines may, for example, be a clock signal, serial data, and a chip selection signal. An example of the communication method using three lines may be the serial peripheral interface (SPI) scheme.

In the embodiments described above, the buffers 112, 113, and 114 are each a buffer that outputs the low-level signal or has the high-impedance output and may each instead be a three-state buffer. Specifically, the buffer 112 that is a three-state buffer has the high-impedance output when the enable signal EN1 has the low level, outputs the low-level signal when the enable signal EN1 has the high level and the clock signal SCL has the low level, and outputs the high-level signal when the clock signal SCL has the high level. The buffer 113 that is a three-state buffer has the high-impedance output when the enable signal EN2 has the low level, outputs the low-level signal when the enable signal EN2 has the high level and the first serial data signal SDA has the low level, and outputs the high-level signal when the first serial data signal SDA has the high level. The buffer 114 that is a three-state buffer has the high-impedance output when the enable signal EN3 has the low level, outputs the low-level signal when the enable signal EN3 has the high level and the second serial data signal SDAM has the low level, and outputs the high-level signal when the second serial data signal SDAM has the high level.

The oscillator 1A, which has the temperature compensation function based on the second temperature detection value DT2 and the frequency control function based on the frequency control value DVC as well as the temperature control function of adjusting the temperature of the vibrator 200 to a value close to a target temperature, is presented as a specific example of the electronic part 1, and the electronic part 1 may be an oscillator that does not have at least one of the temperature compensation function and the frequency control function. The electronic part 1 is not necessarily an oscillator and may, for example, be an inertia sensor, such as an angular velocity sensor and an acceleration sensor.

2. Electronic Instrument

Figure 12:
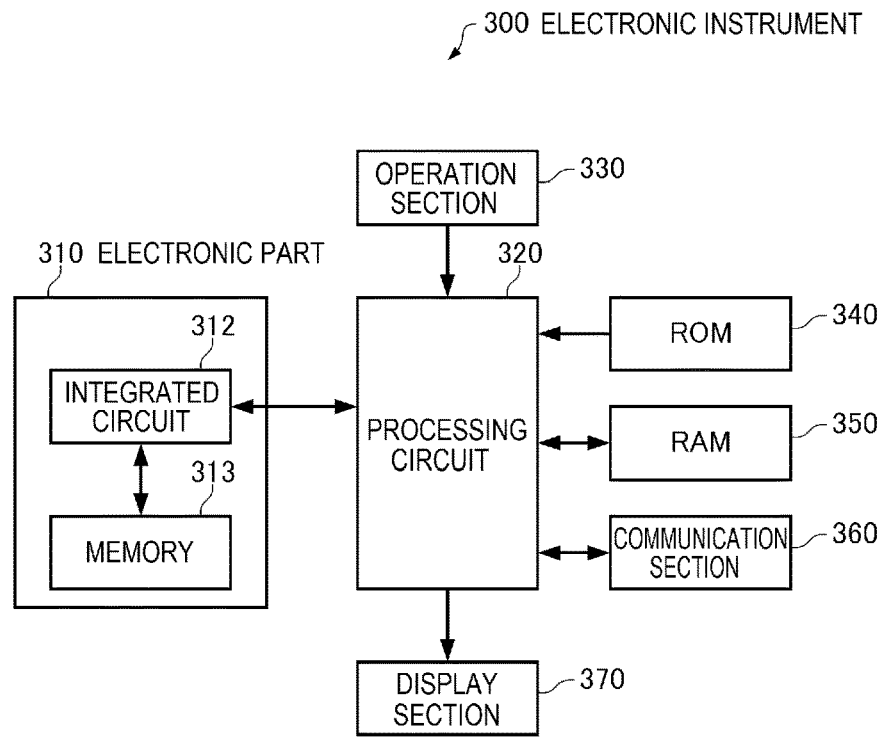
FIG. 12 is a functional block diagram of an electronic instrument according to an embodiment of the present disclosure.

FIG. 12 is a functional block diagram showing an example of the configuration of an electronic instrument according to an embodiment of an embodiment of the present disclosure.

An electronic instrument 300 according to the present embodiment includes an electronic part 310, a processing circuit 320, an operation section 330, a ROM (read only memory) 340, a RAM (random access memory) 350, a communication section 360, and a display section 370. The electronic instrument according to the present embodiment may instead be so configured that part of the components shown in FIG. 12 is omitted or changed or another component is added to the configuration shown in FIG. 12.

The electronic part 310 includes an integrated circuit 312 and a memory 313. The integrated circuit 312 operates based on data stored in the memory 313 and outputs a desired signal to the processing circuit 320. For example, when the electronic part 310 is an oscillator, the electronic part 310 produces an oscillation signal and outputs the oscillation signal to the processing circuit 320.

The processing circuit 320 operates based on the output signal from the electronic part 310. For example, the processing circuit 320 performs a variety of types of calculation and control in accordance with a program stored, for example, in the ROM 340 and by using the oscillation signal inputted from the electronic part 310 as the clock signal. Specifically, the processing circuit 320 carries out a variety of processes according to an operation signal from the operation section 330, the process of controlling the communication section 360 for data communication with an external apparatus, the process of transmitting a display signal for displaying a variety of pieces of information on the display section 370, and other processes.

The operation section 330 is an input apparatus formed, for example, of operation keys or button switches and outputs an operation signal according to a user's operation to the processing circuit 320.

The ROM 340 is a storage that stores programs, data, and other pieces of information for the variety of types of calculation and control performed by the processing circuit 320.

The RAM 350 is a storage that is used as a work area where the processing circuit 320 operates and temporarily stores the programs and data read from the ROM 340, data inputted via the operation section 330, results of computation performed by the processing circuit 320 in accordance with the variety of programs, and other pieces of information.

The communication section 360 performs a variety of types of control for establishing data communication between the processing circuit 320 and an external apparatus.

The display section 370 is a display apparatus formed, for example, of a liquid crystal display (LCD) and displays a variety of pieces of information based on the display signal inputted from the processing circuit 320. The display section 370 may be provided with a touch panel that functions as the operation section 330.

The integrated circuit 312 includes a first clock terminal, a second clock terminal, a first data terminal, a second data terminal, and a first interface circuit that are not shown. A clock signal is inputted from the processing circuit 320 to the first clock terminal, and the clock signal is outputted via the second clock terminal to the memory 313. A first serial data signal is inputted and outputted via the first data terminal from and to the processing circuit 320, and a second serial data signal is inputted and outputted via the second data terminal from and to the memory 313. The first interface circuit includes a control circuit that is not shown but controls the communication state of the integrated circuit 312 to be a first communication state in which the first serial data signal inputted to the first data terminal is outputted as the second serial data signal to the memory 313 via the second data terminal or a second communication state in which the second serial data signal inputted to the second data terminal is outputted as the first serial data signal to the processing circuit 320 via the first data terminal.

The processing circuit 320 outputs the clock signal to the first clock terminal of the integrated circuit 312 and inputs and outputs the first serial data signal from and to the first data terminal of the integrated circuit 312. The processing circuit 320 can thus write and read data to and from the memory 313 via the first interface circuit of the integrated circuit 312 even in a state in which no internal clock is produced in the integrated circuit 312. Therefore, for example, when the electronic part 310 has a problem, and even in a state in which the internal clock source in the integrated circuit 312 is not in operation, the processing circuit 320 can read data stored in the memory 313, analyze a cause of the problem of the electronic part 310, and carry out a process according to the cause of the problem.

Using, for example, the electronic part 1 according to any of the embodiments described above as the electronic part 310 allows, for example, a reliable electronic instrument to be achieved. The integrated circuit 312 and the memory 313 correspond to the integrated circuit 100 and the memory 140 in the embodiments described above, respectively. The processing circuit 320 corresponds to the external apparatus 2 in the embodiments described above.

A variety of electronic instruments are conceivable as the electronic instrument 300. Conceivable examples of the electronic instrument 300 may include a personal computer, such as a mobile personal computer, a laptop personal computer, and a tablet personal computer; a mobile terminal, such as a smartphone and a mobile phone; a digital camera; an inkjet-type liquid ejection apparatus, such as an inkjet printer; a storage area network instrument, such as a router and a switch; a local area network instrument, an instrument for a mobile terminal base station; a television receiver; a video camcorder; a video recorder; a car navigator; a real-time clock apparatus; a pager; an electronic notepad; an electronic dictionary; a desktop calculator; an electronic game console; a game controller; a word processor; a workstation; a TV phone; a security television monitor; electronic binoculars; a POS terminal; a medical instrument, such as an electronic thermometer, a blood pressure gauge, a blood sugar meter, an electrocardiograph, an ultrasonic diagnostic apparatus, and an electronic endoscope; a fish finder; a variety of measuring instruments; a variety of meters for car, airplane, and ship; a flight simulator; a head mounted display; a motion tracer; a motion tracker; a motion controller; and a pedestrian dead reckoning (PDR) apparatus.

Figure 13:
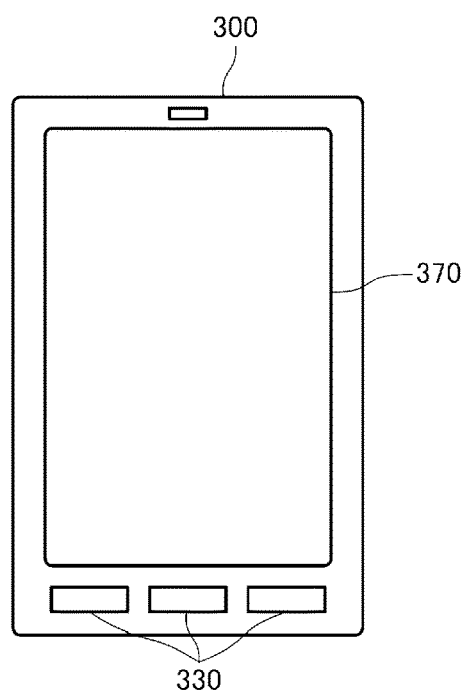
FIG. 13 shows an example of the exterior appearance of an example of the electronic instrument according to the embodiment.

FIG. 13 shows an example of the exterior appearance of a smartphone that is an example of the electronic instrument 300. The smartphone, which is the electronic instrument 300, includes buttons as the operation section 330 and an LCD as the display section 370. The smartphone, which is the electronic instrument 300, can be reliable by using, for example, the electronic part 1 according to any of the embodiments described above as the electronic part 310.

3. Vehicle

Figure 14:
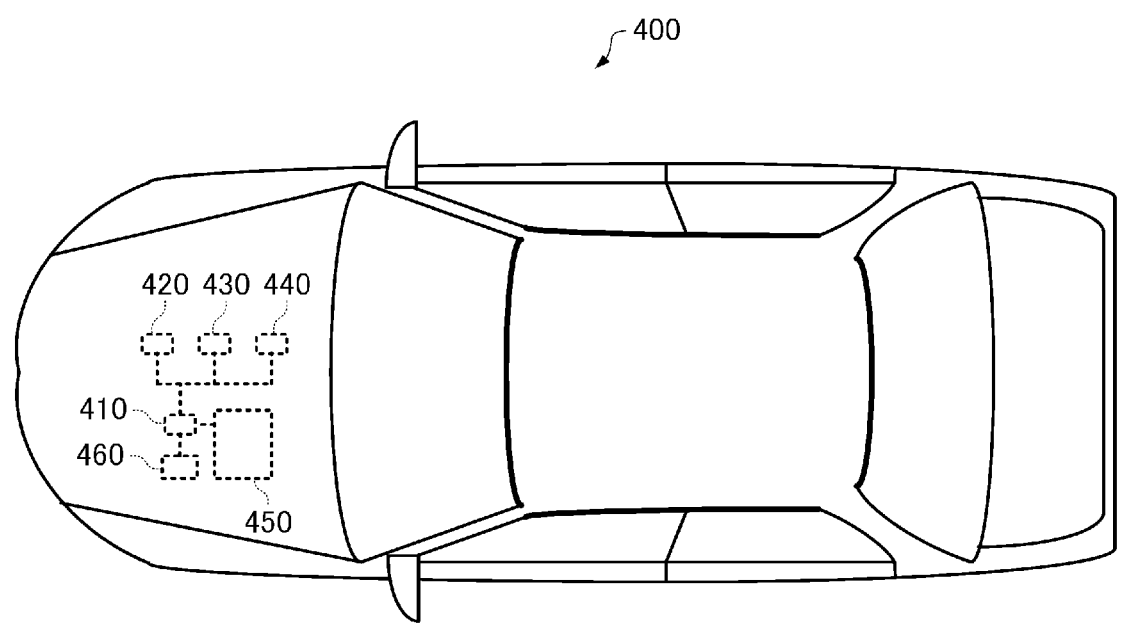
FIG. 14 shows an example of a vehicle according to an embodiment of the present disclosure.

FIG. 14 shows an example of a vehicle according to an embodiment of the present disclosure. A vehicle 400 shown in FIG. 14 includes an electronic part 410, processing circuits 420, 430, and 440, a battery 450, and a backup battery 460. The vehicle according to the present embodiment may be so configured that part of the components shown in FIG. 14 is omitted or another component is added to the components described above.

The electronic part 410 includes an integrated circuit and a memory that are not shown, and the integrated circuit operates based on data stored in the memory and produces a desired signal. For example, when the electronic part 410 is an oscillator, the electronic part 410 produces an oscillation signal and outputs the oscillation signal to the processing circuits 420, 430, and 440. The oscillation signal is used, for example, as a clock signal.

The processing circuits 420, 430, and 440 operate based on the output signal from the electronic part 410 and perform a variety of types of control of an engine system, a brake system, a keyless entry system, and other systems.

The battery 450 supplies the electronic part 410 and the processing circuits 420, 430, and 440 with electric power. The backup battery 460 supplies the electronic part 410 and the processing circuits 420, 430, and 440 with electric power when the voltage outputted from the battery 450 lowers to a value smaller than a threshold.

The integrated circuit of the electronic part 410 includes a first clock terminal, a second clock terminal, a first data terminal, a second data terminal, and a first interface circuit that are not shown. A clock signal is inputted from the processing circuit 420 to the first clock terminal, and the clock signal is outputted via the second clock terminal to the memory of the electronic part 410. A first serial data signal is inputted and outputted via the first data terminal from and to the processing circuit 420, and a second serial data signal is inputted and outputted via the second data terminal from and to the memory of the electronic part 410. The first interface circuit includes a control circuit that is not shown but controls the communication state of the integrated circuit to be a first communication state in which the first serial data signal inputted to the first data terminal is outputted as the second serial data signal to the memory via the second data terminal or a second communication state in which the second serial data signal inputted to the second data terminal is outputted as the first serial data signal to the processing circuit 420 via the first data terminal.

The processing circuit 420 outputs the clock signal to the first clock terminal of the integrated circuit and inputs and outputs the first serial data signal from and to the first data terminal of the integrated circuit. The processing circuit 420 can thus write and read data to and from the memory via the first interface circuit of the integrated circuit even in a state in which no internal clock is produced in the integrated circuit. Therefore, for example, when the electronic part 410 has a problem, and even in a state in which the internal clock source in the integrated circuit is not in operation, the processing circuit 420 can read data stored in the memory, analyze a cause of the problem of the electronic part 410, and carry out a process according to the cause of the problem.

Using, for example, the electronic part 1 according to any of the embodiments described above as the electronic part 410 allows, for example, a reliable vehicle to be achieved. The integrated circuit and the memory provided in the electronic part 410 correspond to the integrated circuit 100 and the memory 140 in the embodiments described above, respectively. The processing circuit 420 corresponds to the external apparatus 2 in the embodiments described above.

The thus configured vehicle 400 is conceivably any of a variety of vehicles, for example, an automobile, such as an electric automobile, an airplane, such as a jet plane and a helicopter, a ship, a rocket, and an artificial satellite.

The present disclosure is not limited to the embodiments described above, and a variety of variations are conceivable to the extent that they fall within the substance of the present disclosure.

The embodiments and the variations described above are presented by way of example, and the present disclosure is not limited thereto. For example, any of the embodiments and the variations can be combined with each other as appropriate.

The present disclosure encompasses substantially the same configuration as the configuration described in the embodiments, for example, a configuration having the same function, using the same method, and providing the same result or a configuration having the same purpose and providing the same effect. Further, the present disclosure encompasses a configuration in which an inessential portion of the configuration described in the embodiments is replaced. Moreover, the present disclosure encompasses a configuration that provides the same operational effect as that provided by the configuration described in the embodiments or a configuration that can achieve the same purpose as that achieved by the configuration described in the embodiments. Further, the present disclosure encompasses a configuration in which a known technology is added to the configuration described in the embodiments.

What is claimed is:

1. An electronic part comprising:
   an integrated circuit; and
   a memory,
   wherein the integrated circuit includes
      a first clock terminal to which a first clock signal is received and inputted from an external apparatus,
      a first data terminal via which a first serial data signal is inputted and outputted,
      a second clock terminal via which the first clock signal received from the external apparatus is outputted from the integrated circuit to the memory,
      a second data terminal via which a second serial data signal is inputted and outputted from and to the memory,
      a clock generation circuit configured to generate a second clock signal, and
      a first interface circuit including a control circuit that is configured to (i) control a communication state of the integrated circuit based on the first clock signal and the first serial data signal to be a first communication state in which the first serial data signal inputted to the first data terminal is outputted as the second serial data signal via the second data terminal in accordance with the first clock signal and a second communication state in which the second serial data signal inputted to the second data terminal is outputted as the first serial data signal via the first data terminal and (ii) selectively control the communication state of the integrated circuit based on a state of the second clock signal.

2. The electronic part according to claim 1,
   wherein the control circuit switches the first communication state to the second communication state and vice versa based on the number of pulses of the first clock signal.

3. The electronic part according to claim 1,
wherein a method of communication performed by the first interface circuit via the first clock terminal and the first data terminal is the same as a method of communication performed between the first interface circuit and the memory via the second clock terminal and the second data terminal.

4. The electronic part according to claim 1,
wherein the integrated circuit includes
   a storage, and
   a second interface circuit that controls writing and reading of data to and from the storage based on the first clock signal and the first serial data signal.

5. The electronic part according to claim 4,
wherein the second interface circuit switches an operation mode of the integrated circuit, based on the first clock signal and the first serial data signal, from a first mode that permits no access to the memory via the first interface circuit to a second mode that permits access to the memory via the first interface circuit, and
the first interface circuit controls writing and reading of data to and from the memory in the second mode by causing the control circuit to control the communication state of the integrated circuit to be the first or second communication state.

6. The electronic part according to claim 4,
wherein when a slave address contained in the first serial data signal has a first address value allocated to the memory, the control circuit of the first interface circuit controls writing and reading of data to and from the memory by controlling the communication state of the integrated circuit to be the first or second communication state, and
the second interface circuit controls writing and reading of data to and from the storage when the slave address has a second address value allocated to the integrated circuit.

7. An electronic instrument comprising:
the electronic part according to claim 1; and
a processing circuit that outputs the first clock signal to the first clock terminal and inputs and outputs the first serial data signal from and to the first data terminal.

8. A vehicle comprising:
the electronic part according to claim 1; and
a processing circuit that outputs the first clock signal to the first clock terminal and inputs and outputs the first serial data signal from and to the first data terminal.

* * * * *